United States Patent
Singh et al.

(10) Patent No.: US 7,935,240 B2
(45) Date of Patent: May 3, 2011

(54) ELECTROPLATING APPARATUS AND METHOD BASED ON AN ARRAY OF ANODES

(75) Inventors: Saravjeet Singh, Santa Clara, CA (US); Manoocher Birang, Los Gatos, CA (US); Nicolay Y. Kovarsky, Sunnyvale, CA (US); Aron Rosenfeld, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1261 days.

(21) Appl. No.: 11/435,213

(22) Filed: May 16, 2006

(65) Prior Publication Data

US 2007/0068819 A1 Mar. 29, 2007

Related U.S. Application Data

(60) Provisional application No. 60/684,444, filed on May 25, 2005.

(51) Int. Cl.
*C25D 5/00* (2006.01)
*C25D 7/12* (2006.01)
*C25D 17/12* (2006.01)

(52) U.S. Cl. .. 205/83; 204/230.2; 204/272; 204/DIG. 7; 205/96; 205/97; 205/123

(58) Field of Classification Search .............. 204/230.2, 204/272, DIG. 7; 205/83, 96
See application file for complete search history.

(56) References Cited

U.S. PATENT DOCUMENTS

| | | | |
|---|---|---|---|
| 4,521,262 A * | 6/1985 | Pellegrino | 156/150 |
| 4,610,756 A * | 9/1986 | Strobel | 216/18 |
| 4,828,654 A * | 5/1989 | Reed | 205/97 |
| 5,368,702 A | 11/1994 | De Nora | |
| 6,187,164 B1 | 2/2001 | Warren et al. | |
| 6,497,801 B1 | 12/2002 | Woodruff et al. | |
| 6,542,784 B1 | 4/2003 | Amaya et al. | |
| 6,565,729 B2 | 5/2003 | Chen et al. | |
| 6,660,137 B2 | 12/2003 | Wilson et al. | |
| 6,773,571 B1 | 8/2004 | Mayer et al. | |
| 6,818,110 B1 | 11/2004 | Warren et al. | |
| 6,830,673 B2 * | 12/2004 | Yahalom et al. | 205/83 |
| 6,916,412 B2 | 7/2005 | Woodruff et al. | |
| 7,368,042 B2 * | 5/2008 | Hsu et al. | 204/228.1 |
| 2003/0038035 A1 * | 2/2003 | Wilson et al. | 205/96 |
| 2004/0055879 A1 * | 3/2004 | Berner et al. | 204/297.01 |
| 2004/0256222 A1 * | 12/2004 | Griego et al. | 204/280 |
| 2005/0084987 A1 | 4/2005 | Wilson et al. | |

OTHER PUBLICATIONS

PCT International Search Report and Written Opinion dated Sep. 24, 2007 for PCT International Application No. PCT/US2006/18792. (APPM/010184PCT).

* cited by examiner

*Primary Examiner* — Alexa D Neckel
*Assistant Examiner* — William T Leader
(74) *Attorney, Agent, or Firm* — Patterson & Sheridan, LLP

(57) ABSTRACT

The present invention generally relates to apparatus and methods for plating conductive materials on a substrate. One embodiment of the present invention provides an apparatus for plating a conductive material on a substrate. The apparatus comprises a fluid basin configured to retain an electrolyte, a contact ring configured to support the substrate and contact the substrate electrically, and an anode assembly disposed in the fluid basin, wherein the anode assembly comprises a plurality of anode elements arranged in rows.

11 Claims, 19 Drawing Sheets

ELECTROPLATING APPARATUS AND METHOD BASED ON AN ARRAY OF ANODES

CROSS-REFERENCE TO RELATED APPLICATIONS

This application claims benefit of U.S. Provisional Patent Application Ser. No. 60/684,444 filed May 25, 2005, which is herein incorporated by reference.

BACKGROUND OF THE INVENTION

1. Field of the Invention

Embodiments of the invention generally relate to electroplating cells having an array of anode elements which may be biased independently.

2. Description of the Related Art

In semiconductor processing, electrochemical plating (ECP) is generally the preferred technique for filling features formed on substrates with a conductive material. A typical ECP process generally includes immersing a substrate into an electrolyte solution that is rich in ions of the conductive material (generally copper), and then applying an electrical bias between a conductive seed layer formed on the surface of the substrate and an anode positioned in the electrolyte solution. The application of the electrical bias between the seed layer and the anode facilitates an electrochemical reaction that causes the ions of the conductive material to plate onto the seed layer.

However, with conventional ECP processes and systems, the conductive seed layer formed on the substrate is generally very thin, and as such, is highly resistive. The resistive characteristics of the seed layer causes the electric field traveling between the anode and the seed layer in a plating process to be much denser near the perimeter of the substrate where electrical contact with the seed layer is generally made. This increased electric field density near the perimeter of the substrate causes the plating rate near the perimeter of the substrate to increase proportionally. This phenomenon is generally known as the "terminal effect", and is an undesirable characteristic associated with conventional plating systems.

The terminal effect is of particular concern to semiconductor processing, because as the size of features continues to decrease and aspect ratios continue to increase, the seed layer thickness will inherently continue to decrease. This decrease in the thickness of the seed layer will further increase the terminal effect, as the decreased thickness of the seed layer further increases the resistivity of the layer. In addition to the decrease in the thickness of the seed layer, the increase of substrate diameter also increases the terminal effect because the seed layer resistivity also increases with the substrate size.

Another challenge in an electrochemical process is that features on some portions of a substrate may be undesirably filled or even filled up while immersing the substrate into a plating bath. During the immersion process, a forward or plating bias is generally applied to counteract etching of the seed layer on the substrate by the plating solution, which is generally an acidic solution. During this time period, which may be as little as 0.25 seconds, some features in certain region on the substrate may be filled which may result in poor uniformity and variable device yield performance.

Previously, anode assemblies with concentric rings which can be biased independently have been tried to overcome the terminal effect. Because substrates are rotated about the same axis of the concentric anode rings, areas corresponding to the region between the anode rings are not exposed enough to the anode rings resulting in another form of non-uniformity. Furthermore, the concentric anode rings can only provide symmetrical bias patterns which are not effective to compensate for the non-uniformity generated during an immersing process.

Therefore, there is a need for an electrochemical plating cell and a method for plating conductive materials onto semiconductor substrates, wherein the plating bias can be set for different regions on the substrate independently to produce uniform or desired plating thickness profiles across the substrate.

SUMMARY OF THE INVENTION

Embodiments of the present invention generally provide electroplating systems having an anode assembly with an array of anodes which can be biased independently.

One embodiment of the present invention provides an apparatus for plating a conductive material on a substrate. The apparatus comprises a fluid basin configured to retain an electrolyte, a contact ring configured to support the substrate and contact the substrate electrically, and an anode assembly disposed in the fluid basin, wherein the anode assembly comprises a plurality of anode elements arranged in rows.

Another embodiment of the present invention provides an electrochemical plating system. The system comprises a fluid basin configured to retain an electrolyte, a substrate support having a contact ring configured to contact a substrate electrically, and an anode assembly having a plurality of anode elements arranged in a pattern and disposed in the fluid basin, wherein the contact ring is configured to connect to the anode assembly via a power supply.

Yet another embodiment provides a method for plating a conductive material on a substrate. The method comprises providing an anode assembly disposing in an electrolyte, wherein the anode assembly comprises a plurality of anode elements arranged in rows, contacting the substrate using a contact ring, immersing the substrate in the electrolyte, and applying a plating bias between the contact ring and the anode assembly.

The details of one or more implementations are set forth in the accompanying drawings and the description below. Other features and advantages of the invention will be apparent from the description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention generally provide an anode assembly to be used in an electroplating cell. The anode assembly generally comprises an array of anode elements which can be biased independently and act as individual anodes. The present invention also provides an electroplating cell having the anode assembly of the present invention disposed therein.

Figure 1:
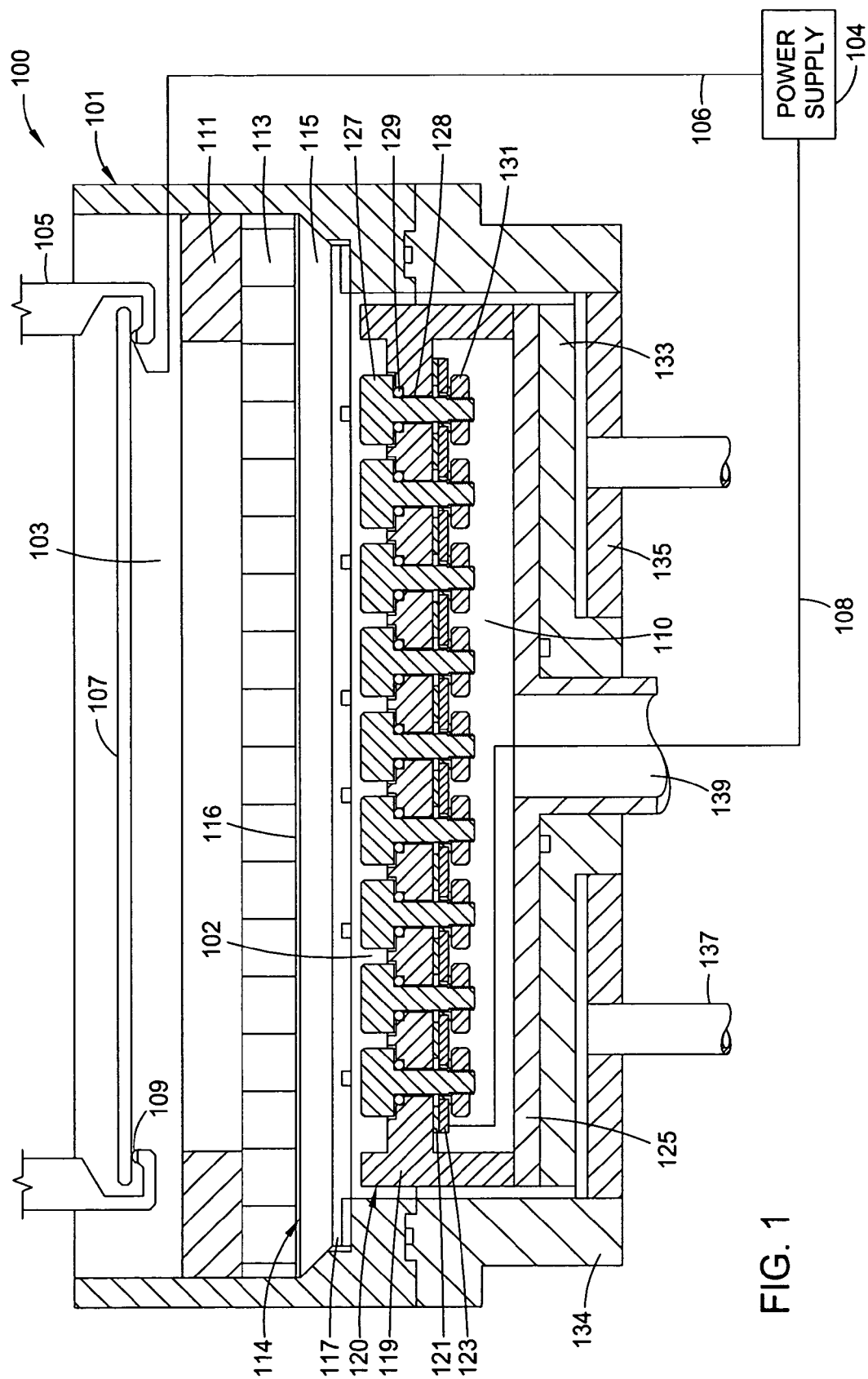
FIG. 1 illustrates a schematic sectional view of one embodiment of an electroplating cell.

FIG. 1 illustrates a schematic sectional view of an exemplary plating cell of the present invention. The electrochemical plating cell 100 generally includes a basin assembly 101 configured to contain a plating solution that is used to plate a metal, e.g., copper, onto a substrate 107 during an electrochemical plating process. During the plating process, the plating solution is generally continuously supplied to the basin assembly 101, and therefore, the plating solution continually overflows out of the basin assembly 101 and is collected and drained for chemical management and/or recirculation.

The basin assembly 101 generally includes basin walls 134, a basin base 135 and a base member 133, configured to contain an electrolyte and direct a flow circulation for the electrolyte contained therein. The basin walls 134 may define a cylindrical volume. The basin base 135 is generally an annular disk attached to the basin walls 134 near an end of the basin walls 134. The basin base 135 may have a central aperture and may have a plurality of fluid inlets/drains 137 connected thereto and configured to individually supply or drain the fluid in the basin assembly 101. The base member 133 is generally disposed in the central aperture of the basin base 135 and generally includes a disk shaped recess formed into a central portion configured to receive an anode assembly 120. The base member 133 may include trenches and slots which may form fluid conduits connected in fluid communication with the plurality of inlets/drains 137. The anode assembly 120 is generally disposed in the recess of the basin base 135.

A membrane support assembly 114 is generally disposed above the anode assembly 120 in the basin assembly 101. The basin assembly 101 defines a volume which may be divided into an anolyte chamber 102 and a catholyte chamber 103 by a membrane 116 stretched on top of the membrane support assembly 114. A diffusion plate 113 may be disposed above the membrane 116 and a collimator 111 may be disposed above the diffusion plate 113. A contact ring 105 having a plurality of contact pins 109 is positioned near the top of the catholyte chamber 103 and is vertically movable relative to the basin assembly 101. The contact pins 109, configured to apply a bias near the perimeter of a substrate 107 to be plated, are in electrical communication with a first terminal 106 of a power supply 104. A second terminal 108 of the power supply 104 is in electrical communication with the anode assembly 120. The power supply 104 may be a single power source with multiple output channels or single power source with multiple switches or may be multiple power sources.

The membrane support assembly 114 generally includes an interior region configured to allow fluids to pass therethrough and may comprise an upper support 115 and a lower support 117. The lower support 117 generally secured at an outer periphery of the base member 133 may be constructed by a series of parallel bars configured to support the upper support 115 and the membrane 116 and to direct the flow in the anolyte chamber 102. The membrane 116 is stretched across the upper support 115 disposed on top of the lower support 117. The membrane 116 generally operates to fluidly separate the catholyte chamber 103 (positioned adjacent the substrate 107 being plated) and the anolyte chamber 102 (positioned adjacent the anode assembly 120). The upper support 115 may include an o-ring type seal positioned near a perimeter of the membrane 116, wherein the seal is configured to prevent fluids from traveling from one side of the membrane 116 secured on the upper support 115 to the other side of the membrane 116. As such, membrane 116 generally provides fluid isolation between the anolyte chamber 102 and the catholyte chamber 103 of the electrochemical plating cell 100, i.e., via use of a cationic membrane. Exemplary membranes that may be used to fluidly isolate an anolyte from a catholyte are illustrated in commonly assigned U.S. patent application Ser. No. 10/627,336 filed on Jul. 24, 2003 entitled "Electrochemical Processing Cell", which is hereby incorporated by reference in its entirety. Alternatively, membrane 116 may be a fluid permeable, filter-type membrane that allows fluids to pass therethrough. In one embodiment, the electrochemical plating cell 100 may be a single chamber plating cell without the membrane support assembly 114.

The diffusion plate 113, which is generally a ceramic or other porous disk shaped member or other fluid permeable electrically resistive member, generally operates as a fluid flow restrictor to even out the flow pattern across the surface of the substrate. Once the plating solution is introduced into the catholyte chamber 103, the plating solution travels upward through the diffusion plate 113. Further, the diffusion plate 113 operates to resistively damp electrical variations in the electrochemically active area of the anode assembly 120 or surface of the membrane 116, which is known to reduce plating uniformities.

The collimator 111 having an annular shape is generally disposed above the diffusion plate 113 and below the contact ring 105. The collimator generally 111 has a diameter smaller than that of the substrate 107 and is configured to constrain the electric field in the catholyte chamber 103.

In one embodiment of the present invention, the anode assembly 120 may include a plurality of anode elements 127 which are arranged in rows which can be biased independently or biased by groups. The anode elements 127 are generally conductive metal plates which may be made of copper, titanium, platinum, platinum coated titanium, or any other metal or conductor. The anode elements 127 have an anode surface and can be a variety of shapes, including the shape of a triangle, a rectangle, a square, a circle, or a hexagon and may be arranged in hexagonal, rectangular, square, and circular arrangements. Hexagonal arrangements may have particular advantages as described below.

In one aspect, an anode frame 119 having a disk shape with a plurality of openings 128 that define a pattern of an arrangement may be used to secure the arrangement of the anode elements 127. In one embodiment, the anode element 127 may have a rod extending from an opposite side of the anode surface. The rod being smaller in size than the anode plate enables each of the anode elements 127 to be supported and held in place by one of the openings 128. Each of the anode elements 127 may further be secured by a nut 131 from an opposite side of the anode frame 119. A seal 129 may be used in each of the openings 128 to prevent the fluid in the anolyte chamber 102 from leaking through the openings 128. An anode base 125 having a central aperture is attached to the anode frame 119 near the perimeter of the anode frame 119. The anode frame 119 and the anode base 125 may form a chamber 110 configured to house the nuts 131 and wirings to power the anode elements 127. A printed circuit board 123 with the same pattern of openings as the anode frame 119 may be used to connect each of the anode elements 127 to a respective power source in the power supply 104. In one aspect, a foil 121 having the same arrangement but larger openings may be used to detect leakage of the fluid in the anolyte chamber 102. The anode frame 119, the foil 121 and the printed circuit board 123 are generally stacked together with their openings in alignment so that the anode elements are isolated from each other and are connected to the power supply 104 independently.

In one aspect, the printed circuit board 123 may have different designs to connect different anode elements 127 in certain geometric patterns. For example, the anode elements 127 may be divided into a plurality of zones by the printed circuit board 123 and the anode elements 127 in each zone may be biased by the same power source. In one aspect, each zone may be a discrete circle or a discrete ring formed by multiple anode elements 127. This concentric ring arrangement is advantageous in implementing a symmetrical patterned bias with limited power sources without producing small rings of unbiased areas in a plating surface as do concentric anode rings. In one aspect, the zones may be a series of parallel strips formed by multiple anode elements. This stripped zone arrangement is advantageous in implementing non-symmetrical patterned bias particularly during an immersing process.

In one aspect, the printed circuit board 123 may be used to mount power chips to control switching of individual anode element 127. The power chips may be used to simplify requirements for the power supply 104, or implement various bias patterns, or enables speedy switching functions.

In one embodiment, not shown, individual anode element 127 may be connected to the power supply 104 by insulated wire conductors in stead of the printed circuit board 123.

Figure 2A:
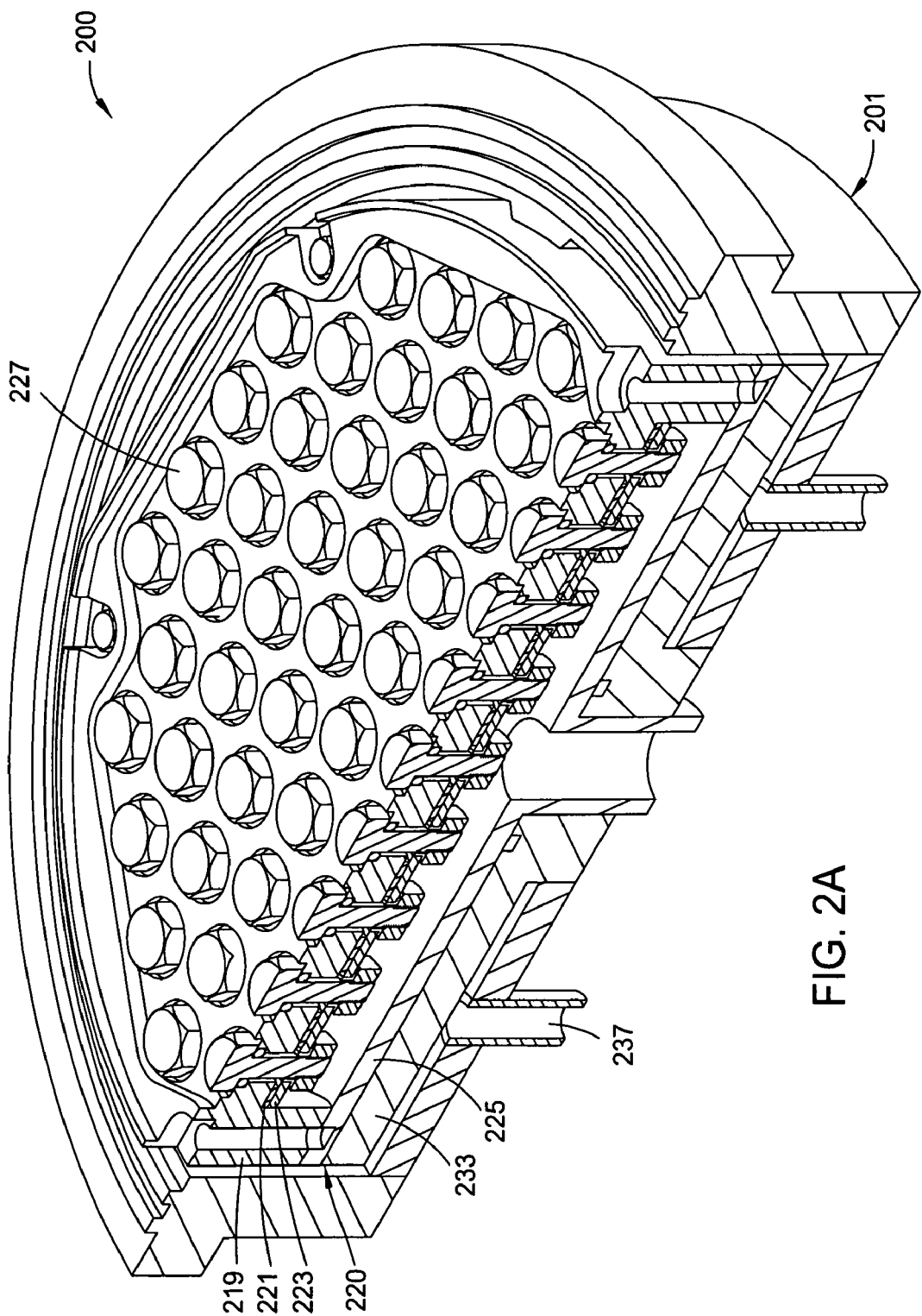
FIG. 2A illustrates a schematic sectional and partial perspective view of one embodiment of an electroplating cell.

FIG. 2A illustrates a schematic sectional and partial perspective view of one embodiment of an anode assembly 220 having a plurality of anode elements 227 arranged in rows. Only the anode assembly 220 and a partial basin assembly 201 of an electrochemical plating cell are shown in FIG. 2A. The anode assembly 220 is generally disposed in the partial basin assembly 201. The plurality of anode elements 227 are generally disposed in an anode frame 219. Each of the anode elements 227 is secured to the stack of the anode frame 219, a foil 221, and a printed circuit board 223 by a conductive nut 233. In one embodiment, the anode elements 227 have a shape of a bolt with a hexagonal head. The heads of the anode elements 227 serve as individual anodes with a hexagonal plate. The anode elements 227 are packed in staggered rows to form a hexagonal arrangement. In one embodiment, the anode elements 227 may be M12 or M16 bolts plated with platinum. In one embodiment, the anode elements 227 may be titanium bolts having a platinum surface layer of about 1 micron to about 6 microns. The platinum surface layer may be plated on the titanium bolts after a process of surface preparation, such as surface machining, chemical treatment and bead blasting.

Figure 2B:
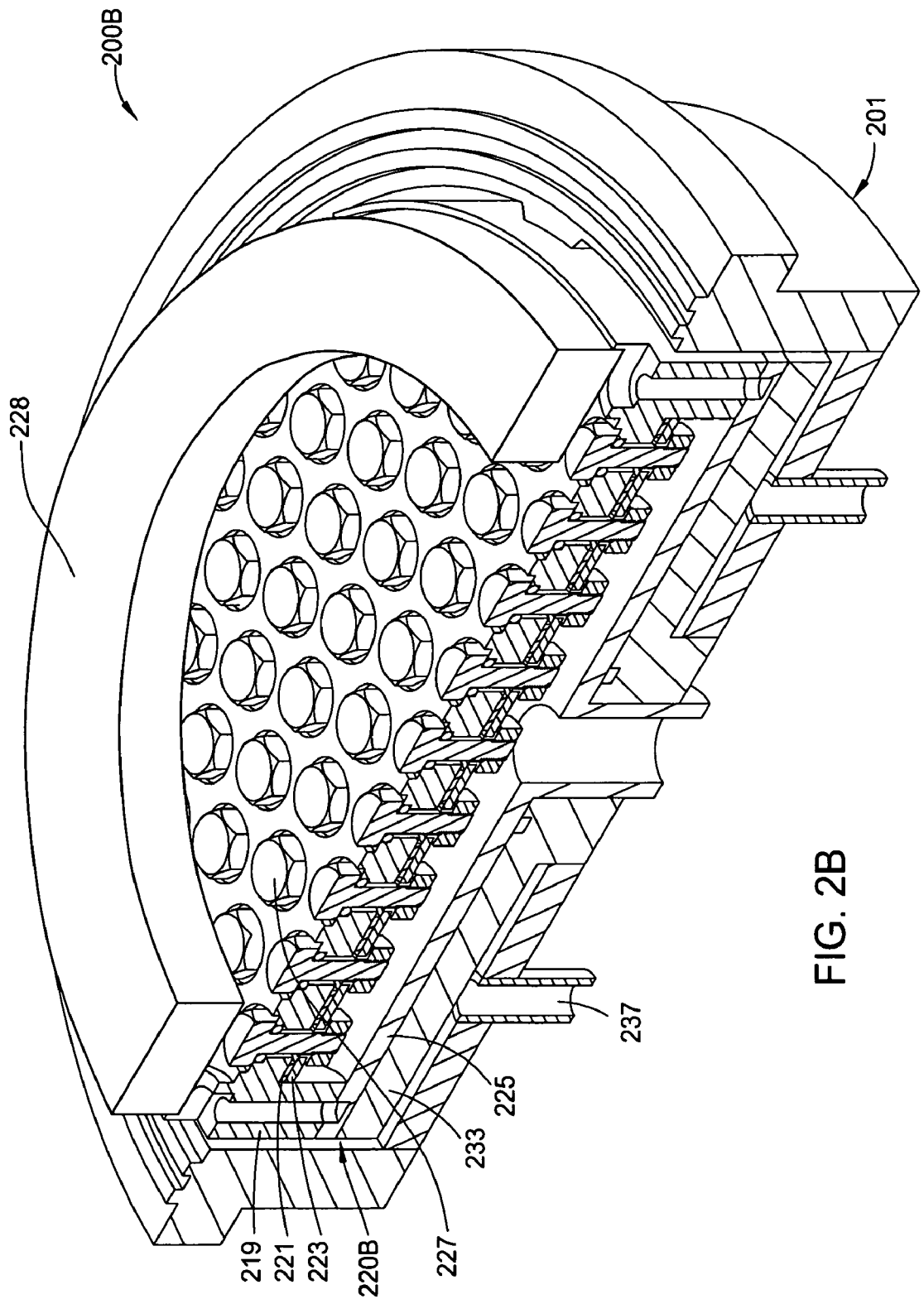
FIG. 2B illustrates a schematic sectional and partial perspective view of one embodiment of an electroplating cell.

FIG. 2B illustrates a schematic sectional and partial perspective view of one embodiment of an anode assembly 220B. The anode assembly 220A is similar to the anode assembly 220 of FIG. 2A except that the anode assembly 220B further comprises a shield 228 disposed above the array of anode element 227. The shield 228 has a ring shape and may be secured to the anode frame 219. The shield 228 is generally made from a non-conductive and chemically inactive material and is configured to keep an outer portion of the anode elements 227 from interacting during a plating process so that the plating process may be performed on only the center portion of a substrate or on a substrate smaller than anode assembly 220B. The shield 228 is configured to have an inner diameter adapted to suit the size of the process region or the substrate being processed in the plating cell. In one embodiment, the shield 228 enables a plating cell to process both 300 mm substrates and 200 mm substrates.

Figure 3A:
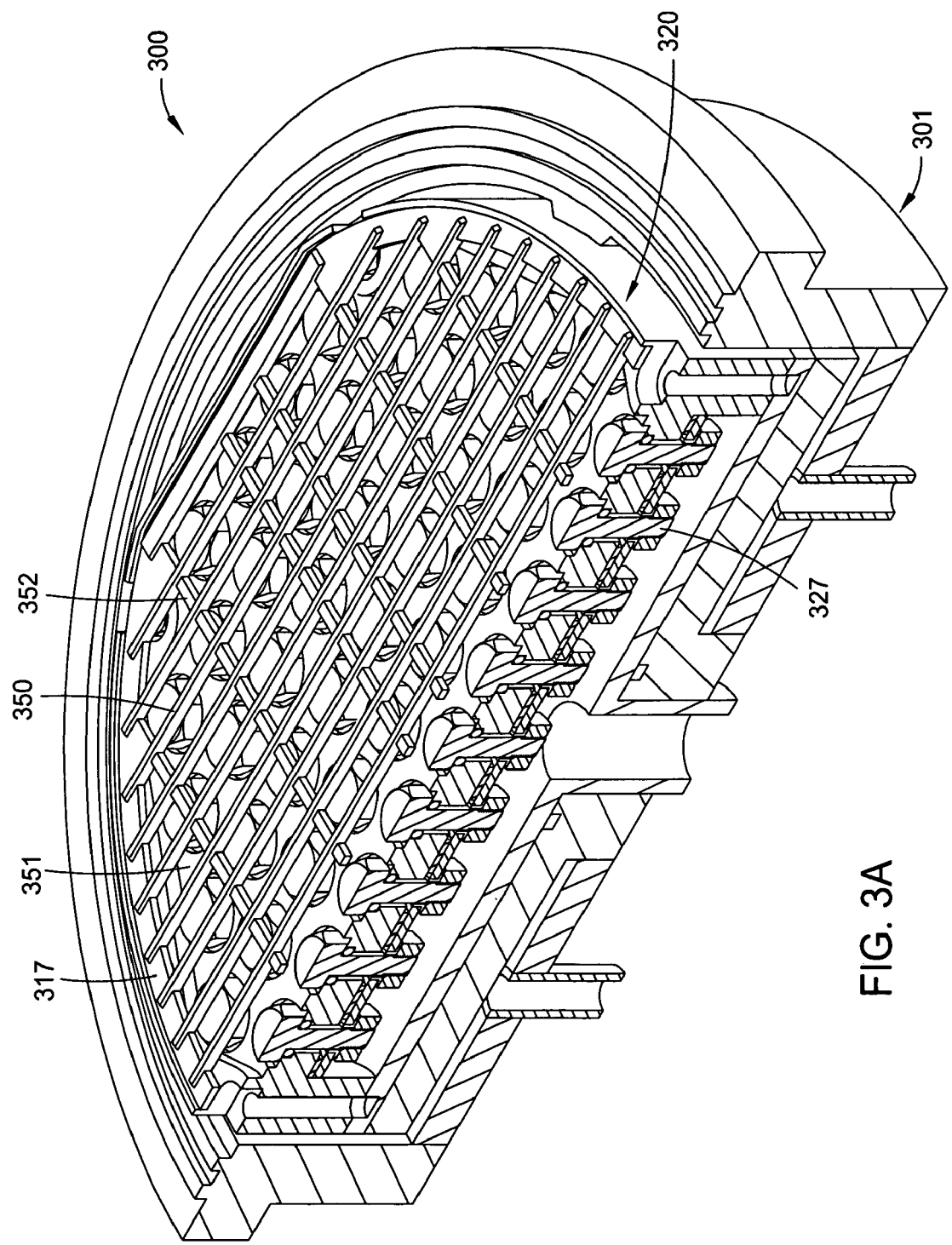
FIG. 3A illustrates a schematic sectional and partial perspective view of one embodiment of an electroplating cell.

FIG. 3A illustrates a schematic sectional and partial perspective view of one embodiment of an electrochemical plating cell 300 An anode assembly 320 comprising an array of anode elements 327 is generally disposed in a basin assembly 301. A grid member 317 is generally positioned on top of the anode assembly 320 near a perimeter of the anode assembly 320. In one aspect, the grid member 317 may have a series of parallel bars 350 joined by an annular ring at the perimeter. In one aspect, thin bars 352 may be positioned perpendicular to the parallel bars 350 to reinforce the structure of the grid member 317. The parallel bars 350 may extend vertically such that a series of parallel channels 351 are created between the parallel bars 350. The parallel channels 351 may be used to direct the flow in the electrochemical plating cell 300 promoting uniform plating thickness. The flow can be directed even more effectively when the parallel channels 351 are in alignment with one set of the boundaries between the anode elements 327.

Figure 3B:
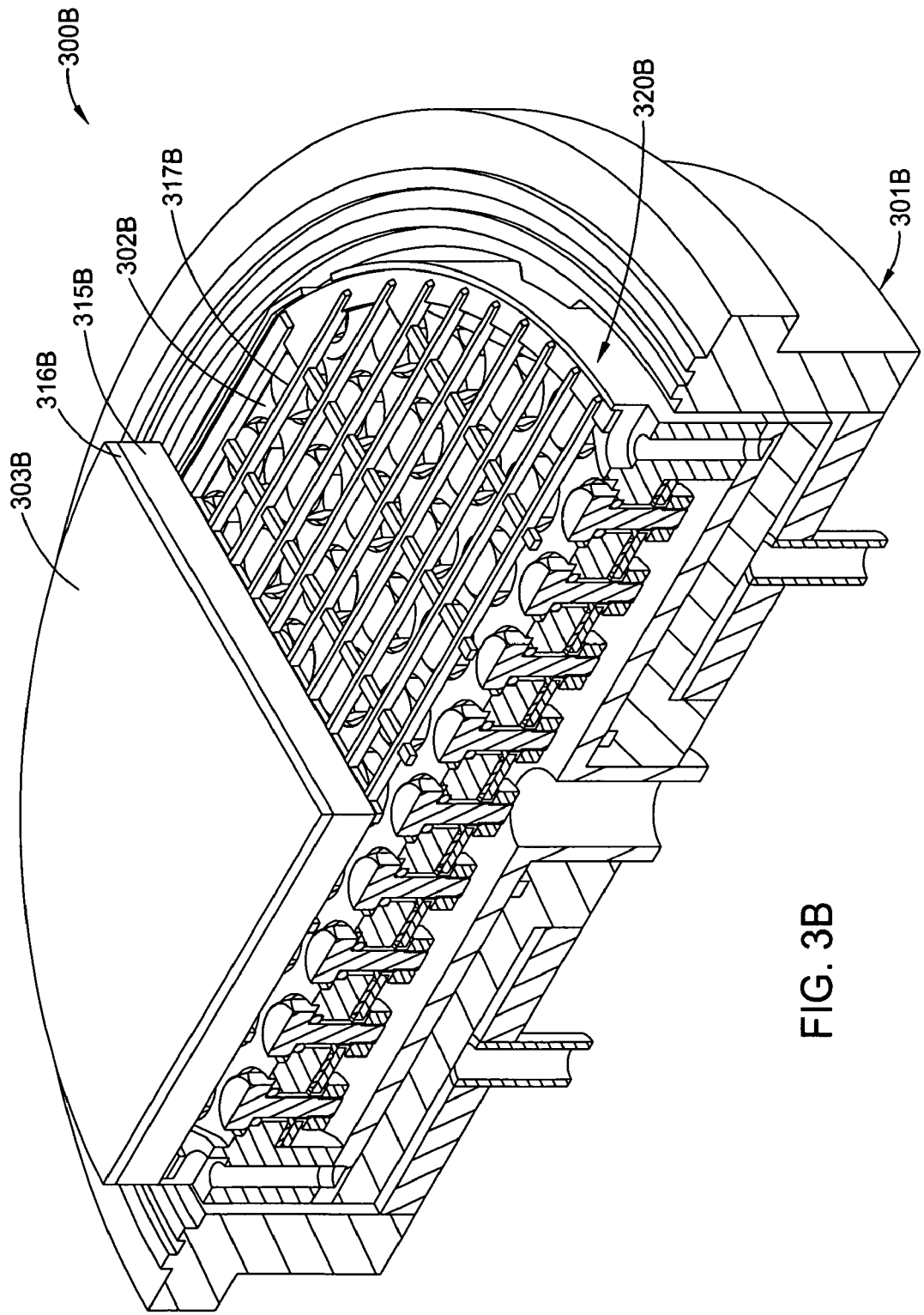
FIG. 3B illustrates a schematic sectional and partial perspective view of one embodiment of an electroplating cell.

In one embodiment, as shown in FIG. 3B, an plating cell 300B is a dual chamber cell having a membrane 316B to separate an anolyte chamber 302B and a catholyte chamber 303B. The membrane 316B is supported by an upper support 315B and a lower support 317B. The lower support 317B having a structure similar to the grid member 317 in FIG. 3A is configured both to support the membrane 316B from sagging and to provide fluid channels for fluid in the anolyte chamber 302B.

Figure 4:
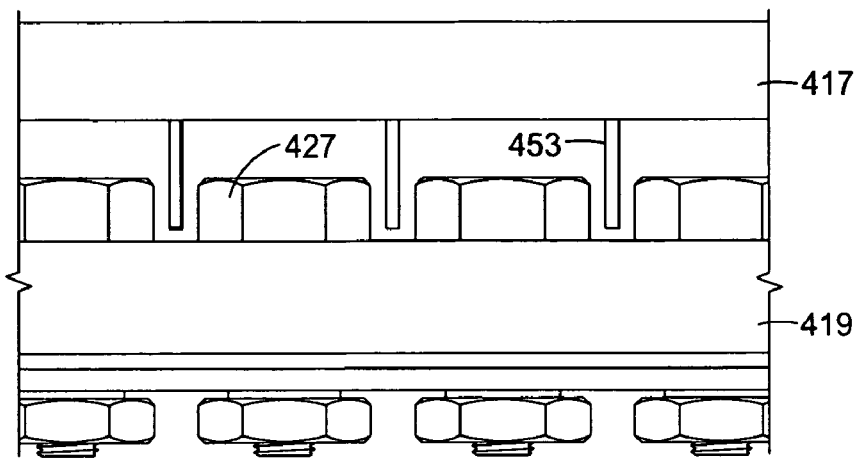
FIG. 4 illustrates a schematic sectional view of one embodiment of an anode element.

In one embodiment, as shown in FIG. 4, a grid member 417 is configured and disposed in a similar way as the grid member 317 illustrated in FIG. 3A. The grid member 417 may have a plurality of curtains 453 extending down toward an anode frame 419 configured to hold a plurality of anode elements 427. Each of the plurality of curtains 453 may be placed between two or more of the anode elements 427 such that the anode elements 427 on opposite sides of the curtain 453 are electrically insulated or at least the distance between the anode elements 427 on opposite sides of the curtain 453 is extended. The curtains 453 thus serve as boundaries among the anode elements 427 reducing cross-talk in the electrolyte especially when the anode elements 427 are biased differently. The size and pattern of the curtains 453 may be designed according to the shape and arrangement of the anode elements 427. In one aspect, when placed in a dual chamber cell having a membrane assembly to separate an anolyte chamber and an catholyte chamber, the grid member 417 may also serve as a lower support member for the membrane.

Figure 5A:
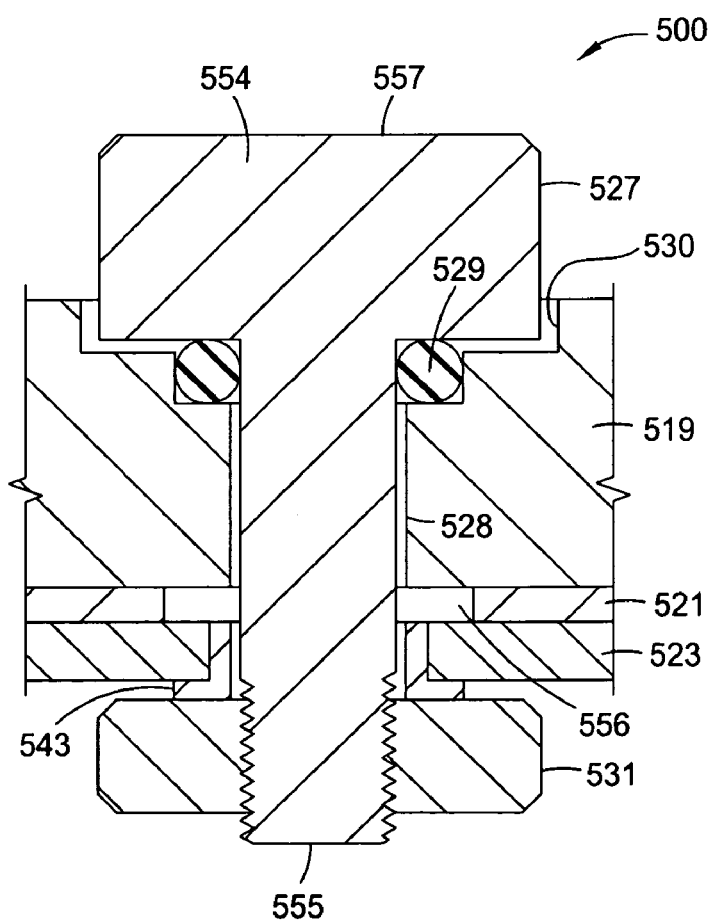
FIG. 5A illustrates a schematic sectional view of one embodiment of an anode element.

FIG. 5A illustrates one embodiment of an anode element 527 of the present invention. The anode element 527 may have a head 554 and a rod 555 extending from the head 554. The head generally has a surface 557 which may have a shape of a triangle, a circle, a square, a hexagon, a rectangle or any other shape depending on the pattern of the anode arrangement. The rod 555 being smaller in size than the head 554 enables the anode elements 527 to be supported and held in place by an opening 528 formed in an recess 530 in an anode frame 519. The recess 530 may have the same shape as the head 554. The anode elements 527 may be secured by a conductive nut 531 from an opposite side of the anode frame 519. A seal 529 may be disposed in the opening 528 to prevent fluid leakage through the opening 528. A foil 521 configured to detect leakage in the opening 528 is generally disposed beneath the anode frame 519. The foil 521 having an opening 556 larger than and may be concentric with the opening 528 is generally in electrical communication with a reference voltage. A printed circuit board 523 with a conductive plate 543 formed in a through hole is disposed beneath the foil 521. The conductive plate 543 may be connected to a power source through a printed-on circuit on the printed circuit board 523. The conductive nut 531 is generally fastened against the anode element 527. This bolt and nut structure secures the anode element 527 in the anode frame 519 and ensures a solid contact between the conductive nut 531 and the conductive plate 543. An electric bias from the corresponding power source is applied to anode element 527 through a path made of the printed-on circuit on the printed circuit board 523, the conductive plate 543, and the conductive nut 531. The anode element 527 then establishes an electric field in an electrolyte in which it is disposed. Any electrolyte leaked into the opening 556 may connect the anode element 527 and the foil 521 and invoke a short circuit between the anode element 527 and the reference electrode connected to the foil 521. The short circuit may then serve as a leakage warning signal.

Figure 5B:
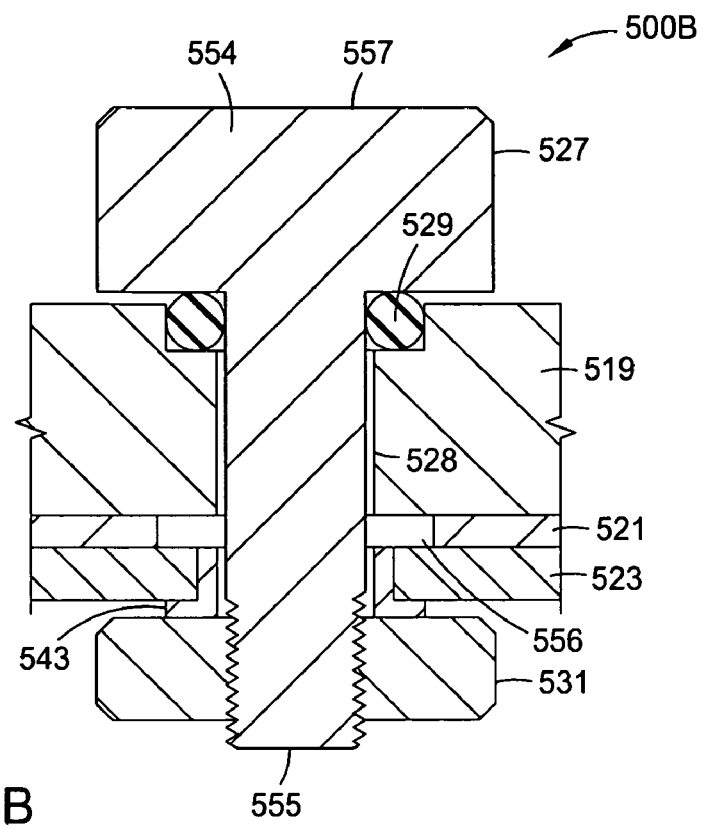
FIG. 5B illustrates a schematic sectional view of one embodiment of an anode element.

FIG. 5B illustrates another embodiment of assembling the anode element 527 of the present invention. Similar to shown in FIG. 5A, the anode elements 527 to be supported and held in place by the opening 528 on the anode frame 519, except that the head 554 is not sitting in a recess.

Figure 5C:
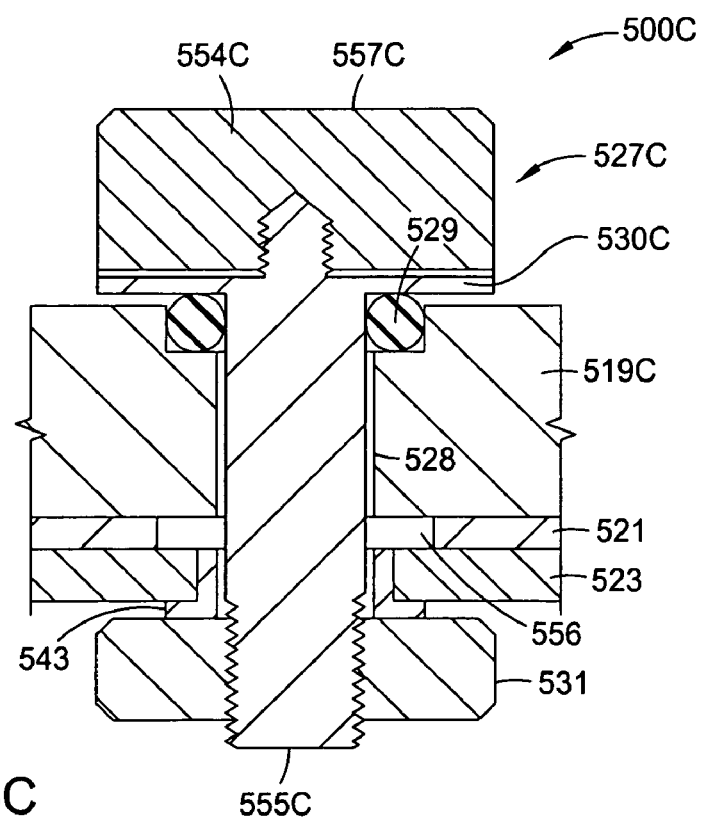
FIG. 5C illustrates a schematic sectional view of one embodiment of an anode element.

FIG. 5C illustrates another embodiment of an anode element 527C of the present invention. The anode element 527C comprises a separated head 554C coupled to a supporting pedestal 530C. The separated head 554C have a surface 557C which may have a shape of a triangle, a circle, a square, a hexagon, a rectangle or any other shape depending on the pattern of the anode arrangement and may be screwed on the supporting pedestal 530C. A rod 555C extends from the supporting pedestal 530C and enables the anode elements 527C to be supported and held in place by an opening 528 an anode frame 519. This configuration enables the separated head 554C to be manufactured separately from the rest of the anode element 527C, which may be economical in some cases.

Figure 6A:
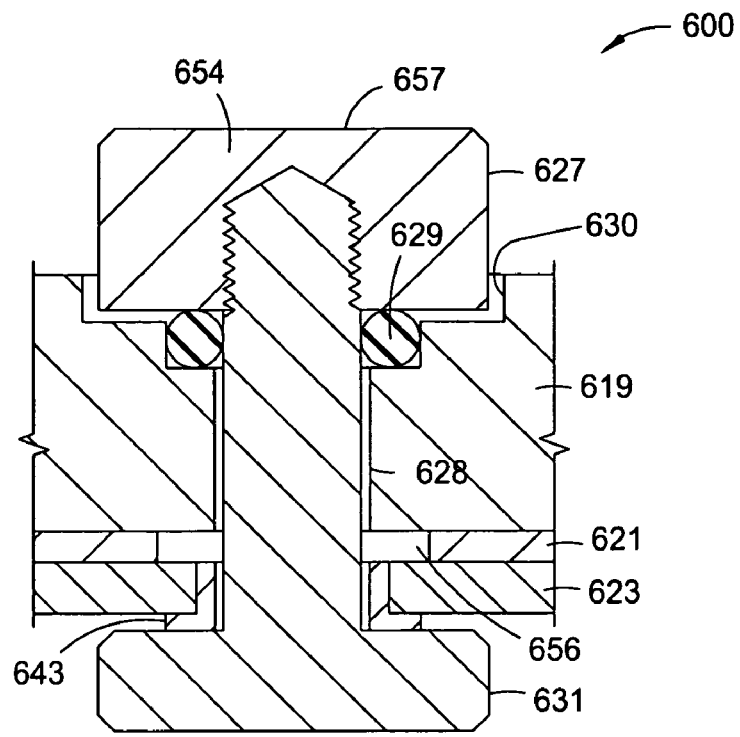
FIG. 6A illustrates a schematic sectional view of one embodiment of the anode element of the present invention.

FIG. 6A illustrates another embodiment of an anode element 627 of the present invention. The anode element 627 generally has a surface 657 which may have a shape of a triangle, a circle, a square, a hexagon, a rectangle or any other shape depending on the pattern of the anode arrangement. The anode element 627 is supported and held in place in a recess 630 formed in an anode frame 619. The anode element 627 may be secured by a conductive bolt 631 from an opposite side of the anode frame 619. A seal 629 may be disposed in the opening 628 to prevent fluid leakage through the opening 628. A foil 621 having an opening 656 larger than and may be concentric with the opening 628 is disposed beneath the anode frame 619. The foil 621 is generally in electrical communication with a reference voltage. A printed circuit board 623 with a conductive plate 643 formed in a through hole is disposed beneath the foil 621. The conductive plate 643 may be connected to a corresponding power source through a printed-on circuit on the printed circuit board 623. The conductive bolt 631 is generally fastened to the anode element 627. This two piece fastening arrangement secures the anode element 627 in the anode base 519 and ensures a solid contact between the conductive plate 643 and the conductive bolt 631. An electric bias from the corresponding power source is applied to anode element 627 through a path made of the printed-on circuit on the printed circuit board 623, the conductive plate 643, and the conductive bolt 631. The anode element 627 then establishes an electric field in an electrolyte in which it is disposed. Any electrolyte leaked into the opening 656 may connect the anode element 627 and the foil 621 and invoke a short circuit between the anode element 627 and the reference electrode connected to the foil 621. The short circuit may then serve as a leakage warning signal. This embodiment is particularly desirable for a consumable anode element.

Figure 6B:
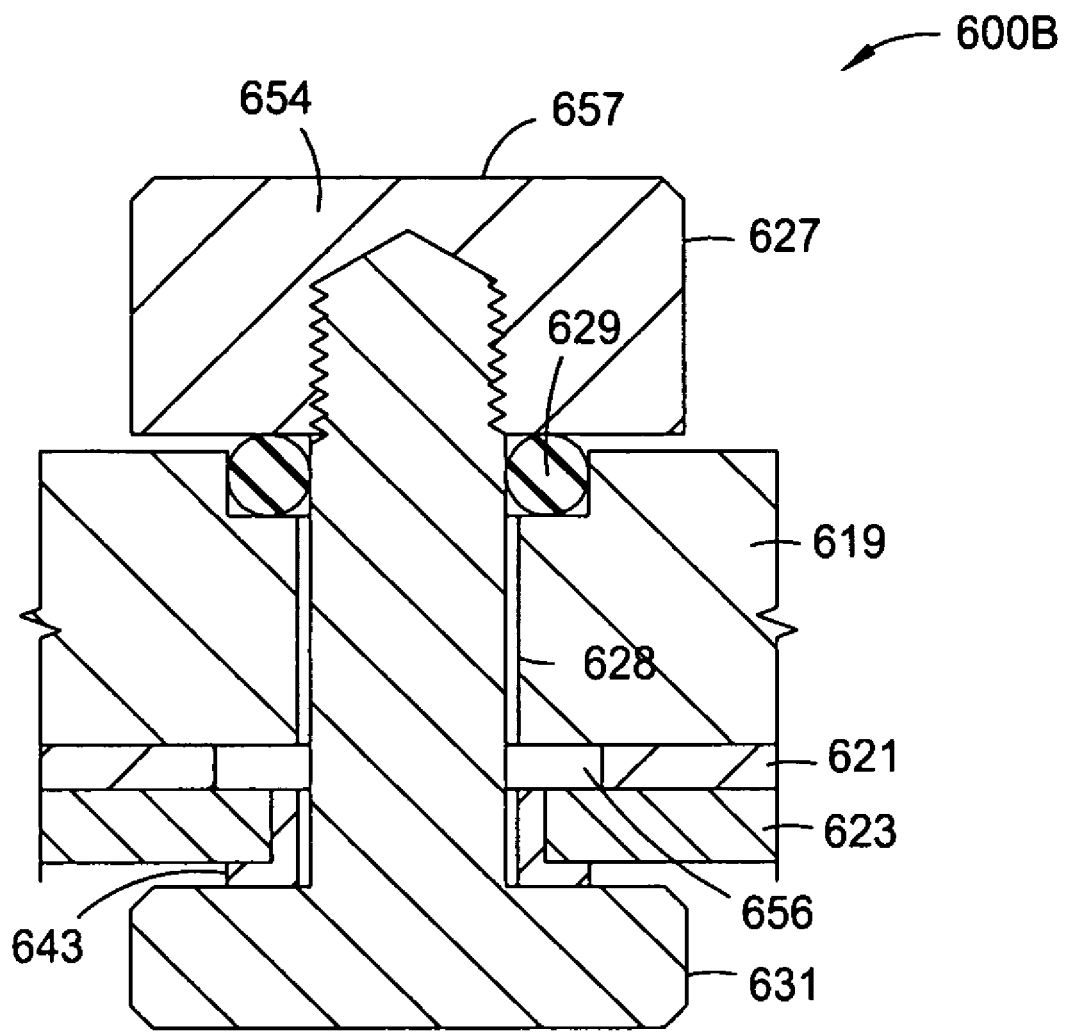
FIG. 6B illustrates a schematic sectional view of one embodiment of the anode element of the present invention.

FIG. 6B illustrates another embodiment of assembling the anode element 627 of the present invention. Similar to shown in FIG. 6A, the anode elements 627 to be supported and held in place by the opening 628 on the anode frame 619, except that the head 654 is not sitting in a recess.

Figure 7:
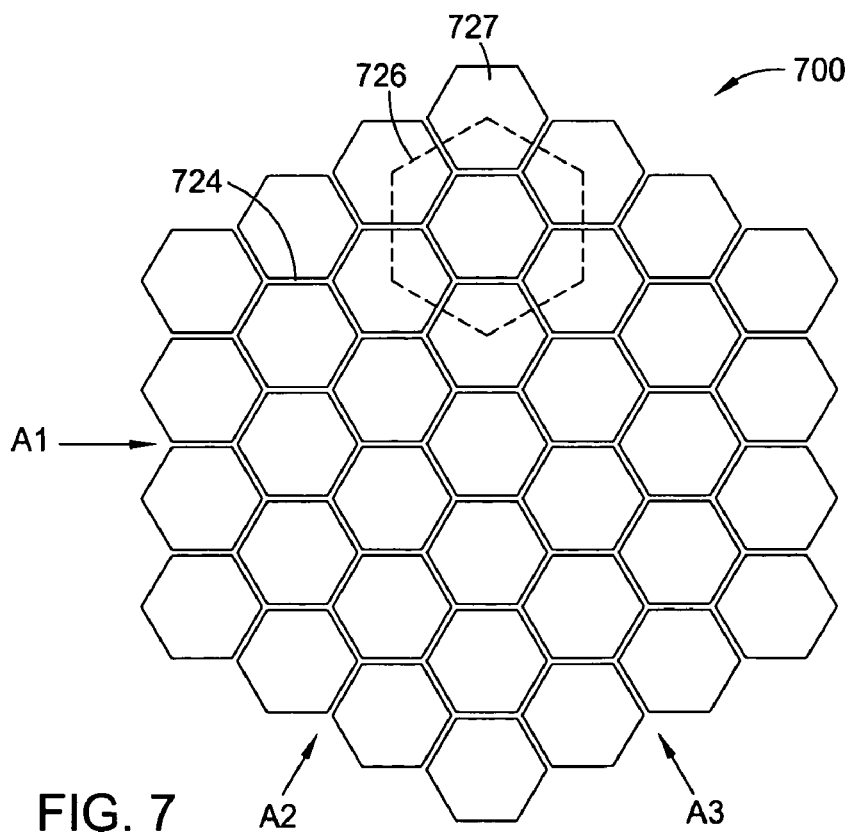
FIG. 7 illustrates a schematic top view of one embodiment of an anode arrangement.

FIG. 7 illustrates a top view of one embodiment of an anode arrangement 700 of the present invention. An anode assembly 719 includes a plurality of anode elements 727 each having a plate of a regular hexagon arranged in staggered rows. The anode elements 727 are arranged in a hexagonal pattern as shown in FIG. 7. Each anode element 727 except those on an edge of the anode assembly 719 has six immediate neighbors, the centers of which form another regular hexagon 726. Two immediate neighboring anode elements 727 share one boundary 724. A hexagonal packing is of advantage in various ways. First, the coverage of an array of hexagonal packed anode elements 727 is the closest to the coverage of an one piece anode among other arrangements with the same number of anode elements because a hexagonal packing is the most effective packing. Second, both symmetrical or non-symmetrical bias patterns can be facilitated by biasing the anode elements 727 independently because the hexagonal packing is homogenous. This feature makes the hexagonal packing desirable in both generating uniform profiles and controlling an immersing process. Third, the boundaries 724 are three sets of parallel boundaries along three directions, A1, A2, and A3, which allow the flow of electrolyte near the anode assembly 719 to be set along one of the three directions. This feature is more advantageous in a hexagonal packed triangle arrangement shown below.

Figure 8A:
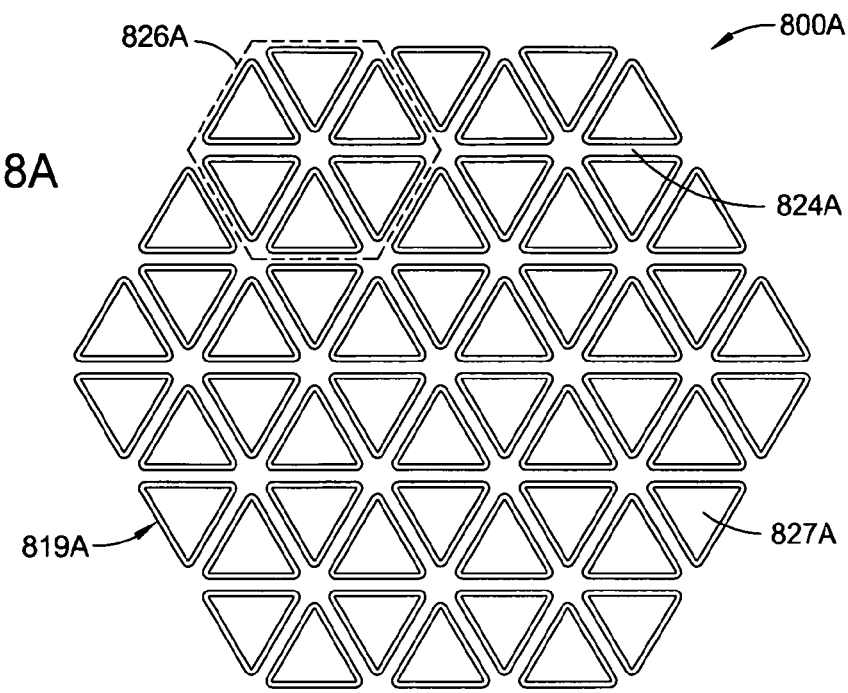
FIG. 8A illustrates a schematic top view of one embodiment of an anode arrangement.
Figure 8B:
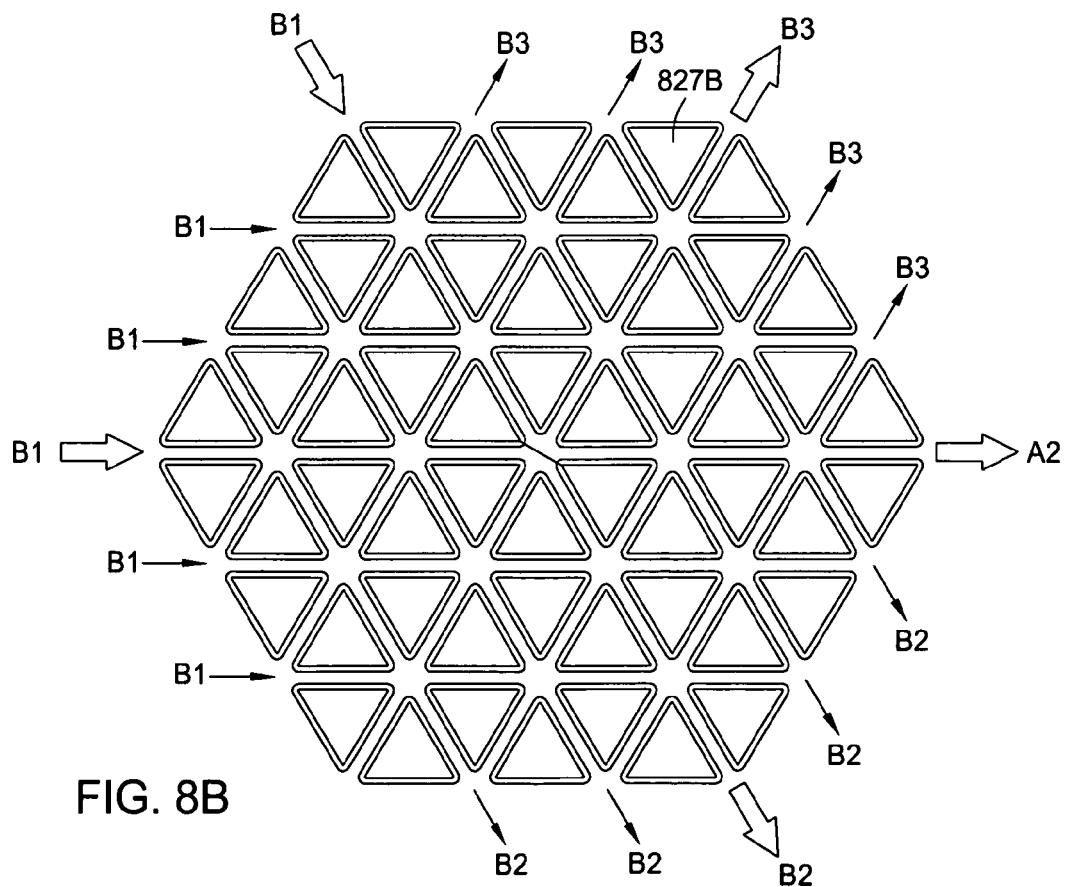
FIG. 8B illustrates a schematic top view of one embodiment of an anode arrangement indicating flow directions.

In another embodiment, a grid of triangle anode elements 827A is arranged in a hexagonal pattern, as shown in FIG. 8A. Each of the anode elements 827A has an equilateral triangle plate. Each anode element 827A except those on an edge of the anode assembly 819A has three immediate neighbors. Two immediate neighboring anode elements 827A share one boundary 824A. Every six anode elements 827A share one vertex and form a regular hexagon 826A. Thus, this hexagonal packed triangle arrangement has every advantage of a hexagonal arrangement shown in FIG. 7. Further more, the boundaries of a hexagonal packed triangle arrangement contain three sets of boundaries in straight lines as marked by arrows B1, B2 and B3 in FIG. 8B. Referring to FIG. 8B, one of the three sets of the boundaries, for example those marked by arrows B1, may be used to direct the fluid flow near the anode elements. The boundaries not used in directing fluid flow, for example those indicated by arrows marked B2, may be used for flow channels for a counter flow, such as the flow of concentrated $CuSO_4$ solution from the top of anode surface in a tilted electrochemical plating cell.

Figure 8C:
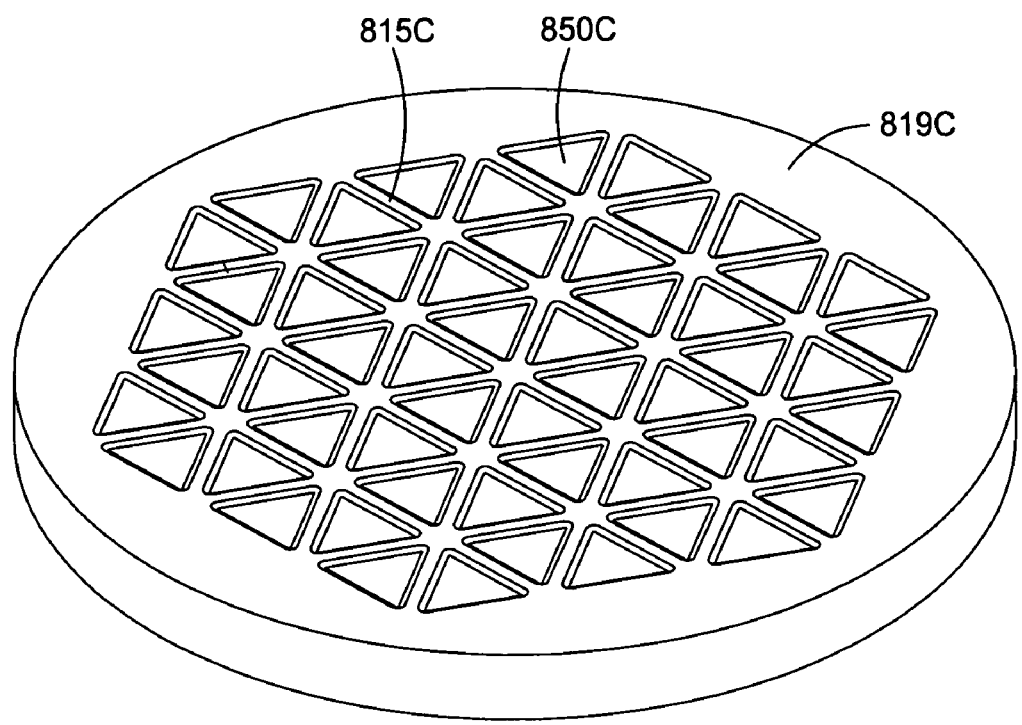
FIG. 8C illustrates a schematic perspective view of an anode base for the anode arrangement shown in FIG. 8B.

FIG. 8C illustrates one embodiment of an anode frame 819C for the hexagonal arrangement of triangle anode elements shown in FIGS. 8A-8B. In one aspect, a plurality of triangle openings 860C may be built in the anode frame 819C. The openings 850C are separated by three groups of parallel boundaries 851C. The anode frame 819C may be made of plastic, ceramic, coated metal or any other dielectric materials. Triangle anode elements in shape of triangle plates, or bolts with triangle heads may be placed in the openings 850C to form an anode assembly. Three series of flow channels may be generated between the anode elements and above the boundaries 851C. The boundaries 851C are insulated thus provide additional resistance between the anode elements through electrolyte and reduce cross-talk and allow the anode elements to be placed far away from a substrate to be plated.

Figure 8D:
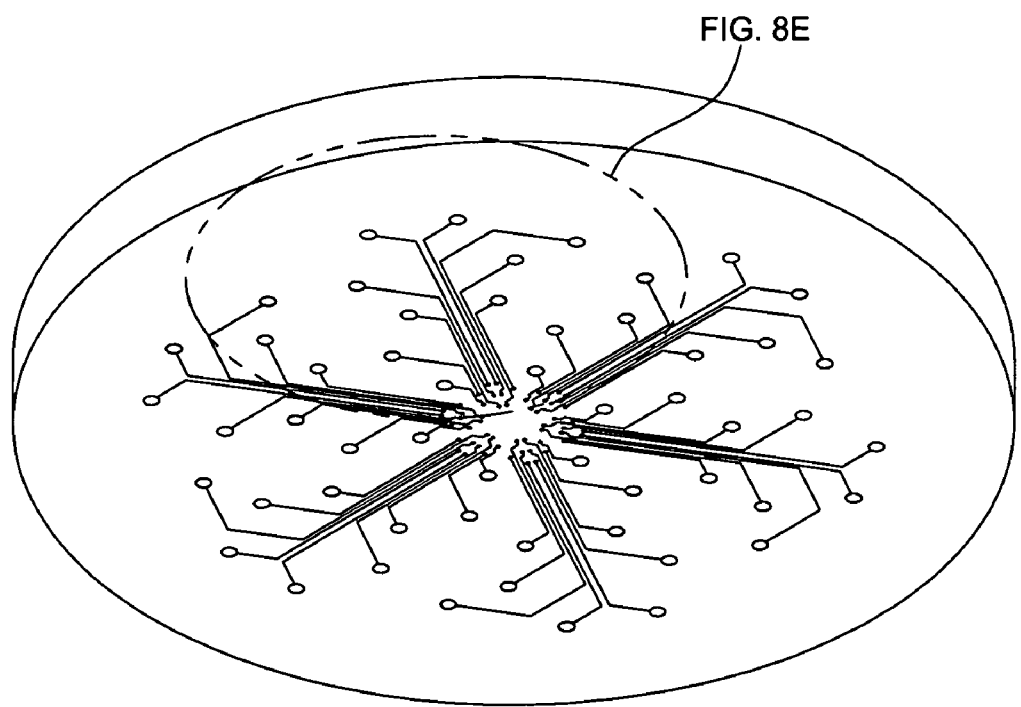
FIG. 8D illustrates a perspective view of a printed circuit board connector for the anode arrangement shown in FIG. 8B.
Figure 8E:
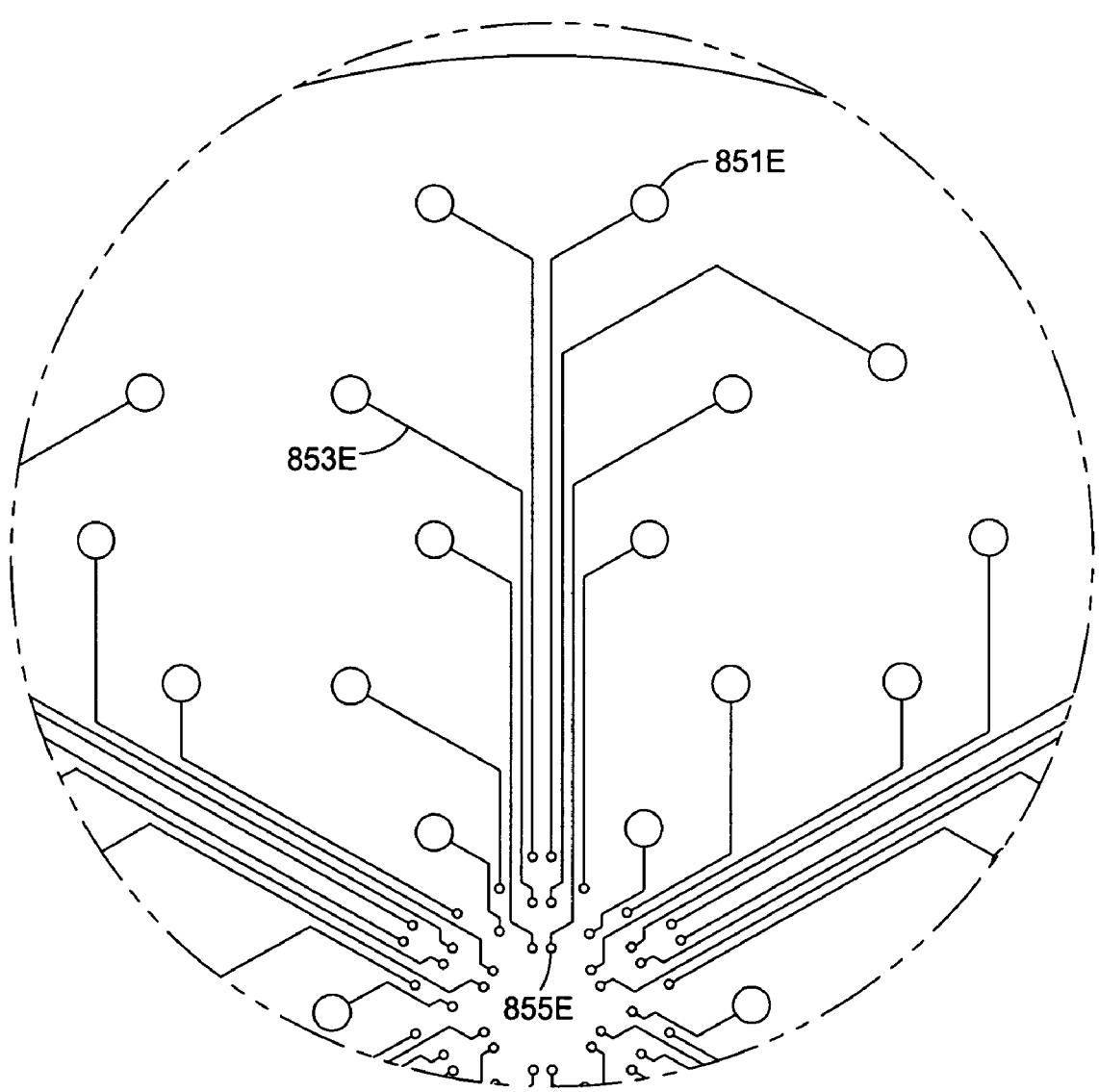
FIG. 8E illustrates an exploded view of the printed circuit board connector shown in FIG. 8D.

FIG. 8D illustrates a perspective view of an exemplary printed circuit board designed to connecting the anode elements, e.g. triangle anode elements, in the arrangement shown in FIG. 8B. FIG. 8E shows an exploded view of area 8E of the printed circuit board in FIG. 8D. Conductive plates 851E are configured to connect an anode element. Conductive points 855E are configured to connect to corresponding power source. Conductive lines 853E connect the conductive points 855E to the conductive plates 851E.

Figure 9A:
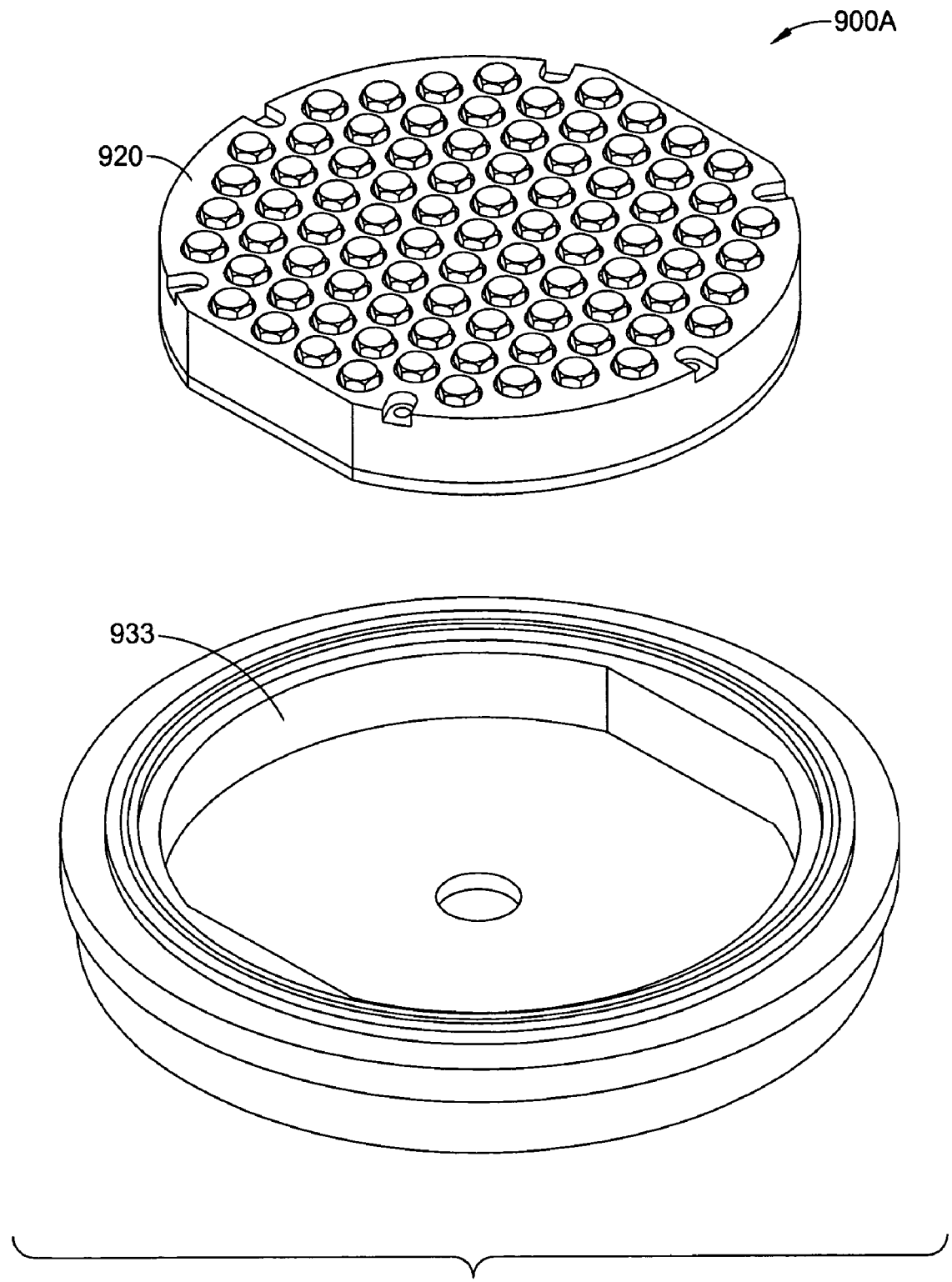
FIG. 9A illustrates an exploded view of one embodiment of an anode assembly.
Figure 9B:
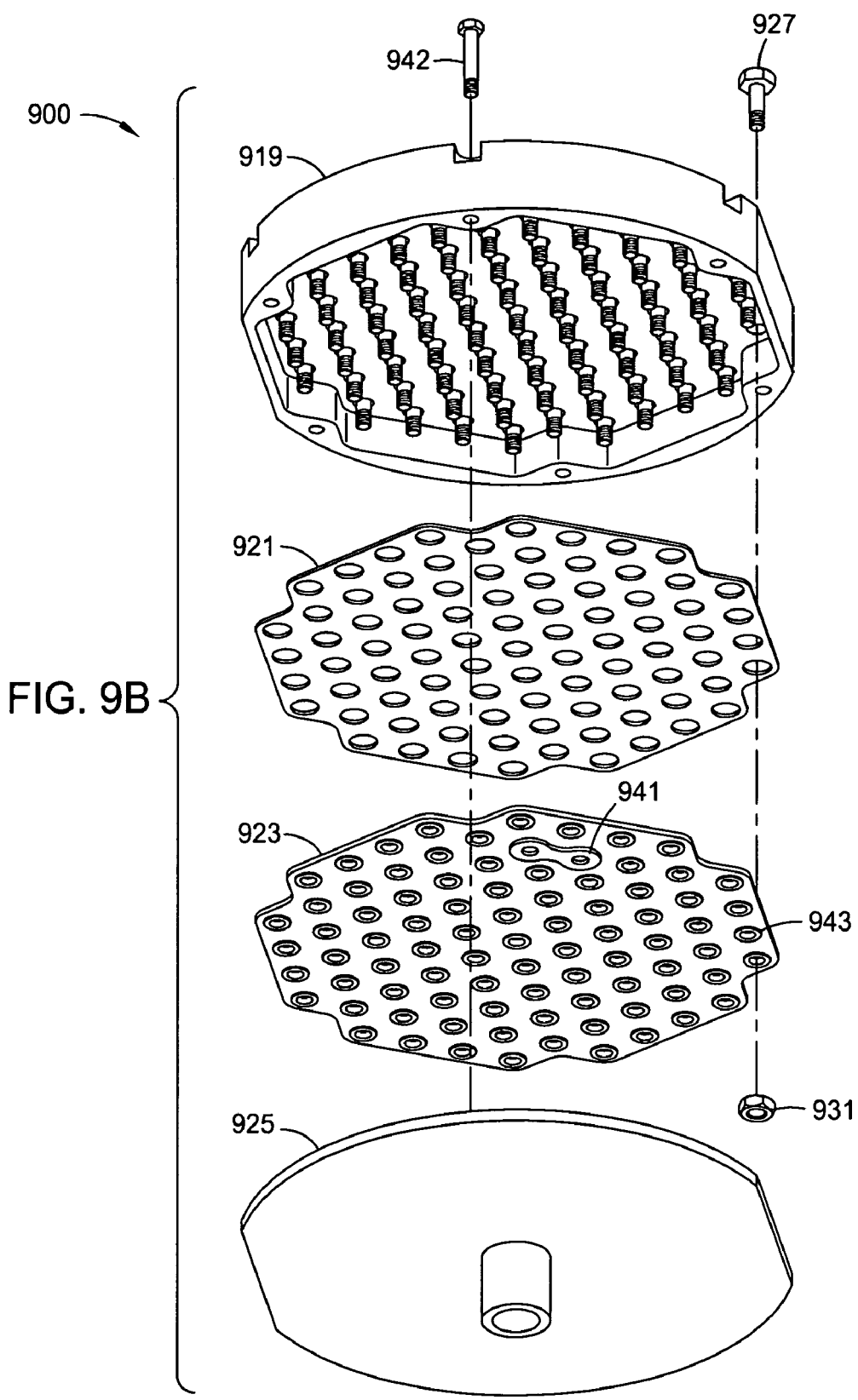
FIG. 9B illustrates an exploded view of one embodiment of the anode assembly of the present invention.

FIG. 9A illustrates one embodiment of an anode assembly 920 of the present invention. In this embodiment, the anode assembly 920 is assembled together such that it can be installed into or removed from a base member 933 as an unit. The anode assembly 920 is easy to maintain or replace. FIG. 9B illustrates one embodiment of the anode assembly 920 shown in FIG. 9A. A plurality of anode elements 927 are placed in an anode frame 919 and secured by a plurality of nuts 931 with a foil 921 with a plurality of openings and a printed circuit 923 having a plurality of contact rings stacked between the anode frame 919 and the nuts 943. The anode frame 919 is then fastened to an anode base 925 by a plurality of screws 942. Connectors 941 having a binocular shape may be used to connect adjacent anode elements and to form additional patterns.

The embodiments of the present invention have advantages in reducing the terminal effect, compensating uneven plating produced during emersion and controlling plating profiles. In one aspect, a set of sensors configured for measuring cell current distributions in a plating solution may be disposed in a plating cell comprising an anode assembly of the present invention. A control unit may be adapted to adjusting process parameters including charge currents of each anode elements. The set of sensors may be used to generate in-situ plating thickness profiles during a plating process, monitoring immersing status and filling thickness during an immersing process. Exemplary sensor that may be used to measuring differential voltage, methods that may be used to generating in-situ plating thickness profiles and controller units may be used to control process parameters are illustrated in commonly assigned U.S. patent application Ser. No. 11/137,711 filed on May 25, 2005 entitled "In-situ profile measurement in an electroplating process", which is hereby incorporated by reference in its entirety. In one aspect, during a plating process, anode elements of the anode assembly of the present invention may be charged with anodic currents independently upon receiving an in-situ thickness profile to generate a uniform thickness profile or a desired thickness profile. In one aspect, the charge patterns can be set based on pre-measurement of a substrate to be plated to compensate for non-uniformity. In one aspect, non-axial-symmetric charge patterns may be used during an immersing process.

Figure 10:
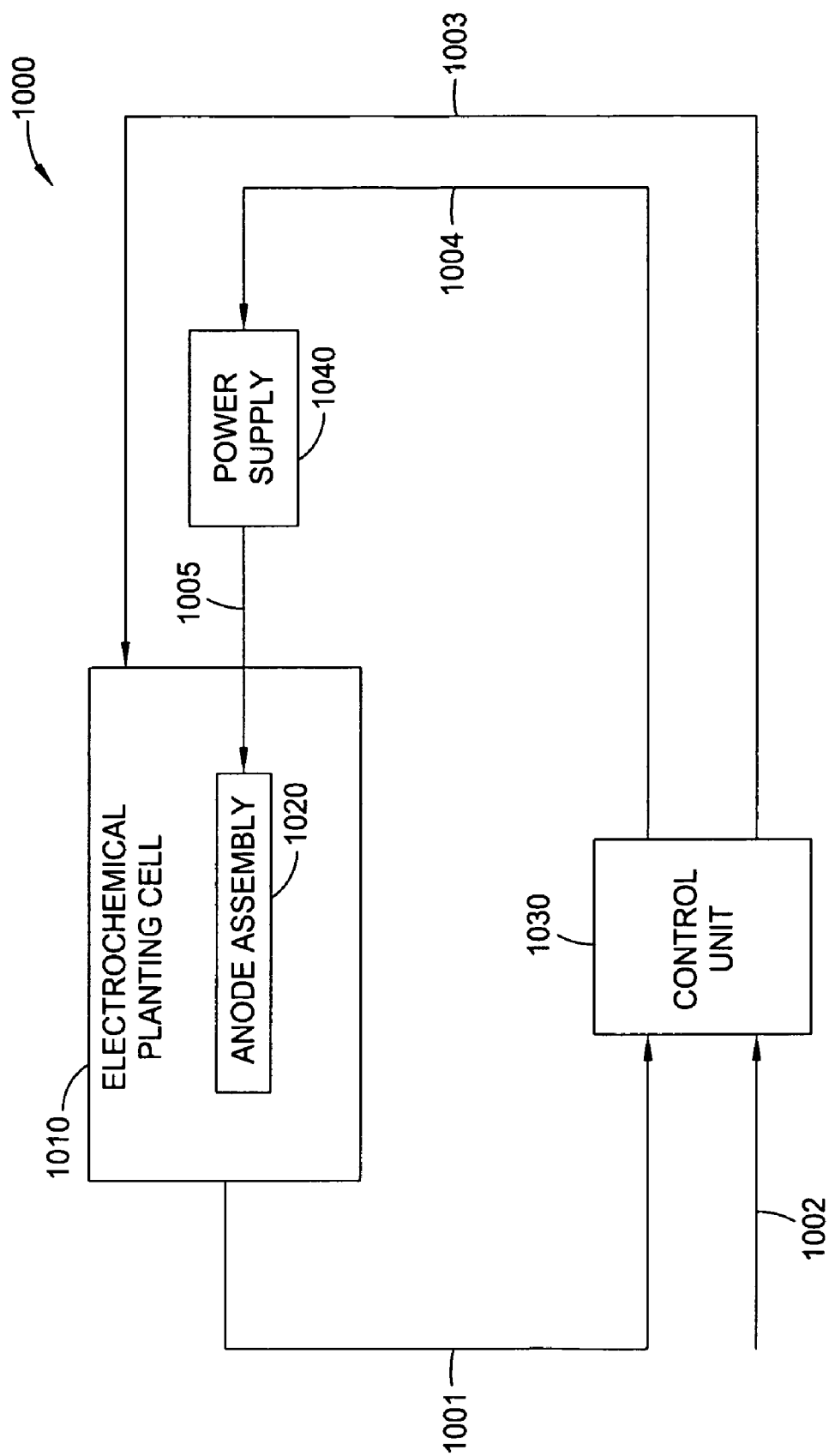
FIG. 10 illustrates an exemplary embodiment of an electrochemical plating system having a control unit.

FIG. 10 illustrates an exemplary embodiment of an electrochemical plating system 1000. An electrochemical plating cell 1010 having an anode assembly 1020 is connected to a control unit 1030 by a first group of input cable 1001. The anode assembly 1020 generally includes an array of anode elements which may be biased independently by a power supply 1040 through a power cable 1005. The input cable may be configured to transfer sensor signals, such as cell current distributions, solution temperature, acidity, anode condition. The control unit 1030 may have a second group of input cables 1002 configured to input variables other than signals, such as a desired thickness profile, a pre-measured profile, and process parameters. The control unit 1030 is connected to the power supply 1040 by a first group of control cable 1004 configured to output control signals, such as current set point and anode time for each of the anode elements in the anode assembly 1020. A second group of control cables 1003 connects the control unit 1030 and the electrochemical plating cell 1010. The control cables 1003 are configured to send control signals to adjust process parameters of the electrochemical plating cell 1010. The control unit 1030 is configured to adjust the process parameters of the electrochemical plating cell 1010 according to various input variables. This embodiment has advantages in reducing the terminal effect, compensating uneven plating produced during emersion and controlling plating profiles. In one aspect, a set of sensors configured for measuring cell current distributions in a plating solution may be disposed in the electrochemical plating cell 1010. The control unit 1030 may be used to adjust charge currents of the anode elements in the anode assembly 1020 upon receiving the current measurements through the input cable 1001. In one aspect, the control unit 1030 may set charge currents for each anode elements according to a pre-measured profile received through the input cable 1002.

Figure 11A:
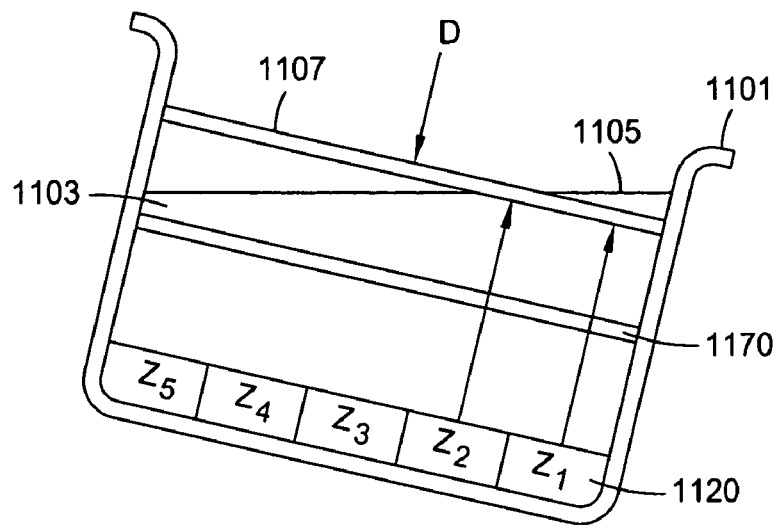
FIG. 11A illustrates a schematic view of a substrate immersing process.
Figure 11B:
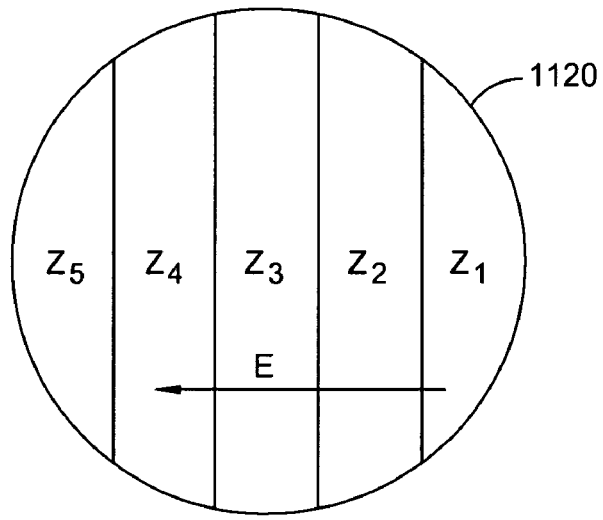
FIG. 11B illustrates a schematic view of a zone map for an anode assembly.
Figure 11C:
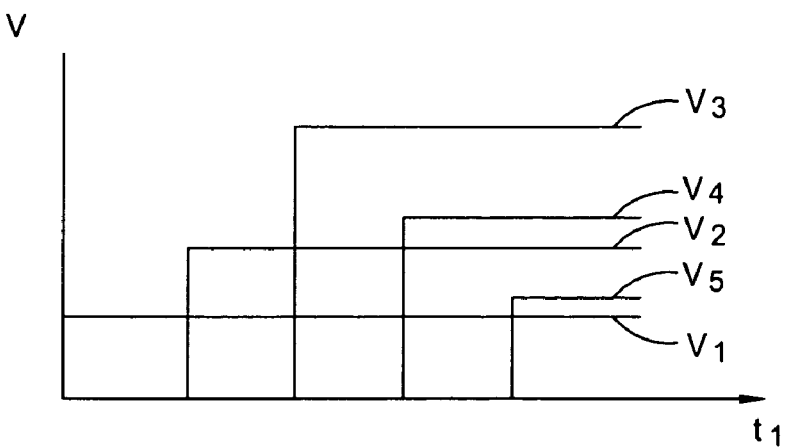
FIG. 11C illustrates a schematic view of a bias pattern to be applied during a substrate immersing process.

In one aspect, the electrochemical plating system 1000 may be used to perform an immersing process with a controlled bias pattern to reduce uneven plating. Referring to FIG. 11A, a substrate 1107 is immersing into an electrolyte 1103 contained in a tilted basin 1101 along direction D. An anode assembly 1120 having an array of anode elements which are grouped into a plurality of zones $Z_n$ is disposed in the electrolyte 1103. A set of sensors 1170 configured to measuring current density in the electrolyte may be disposed in the electrolyte 1103. In one embodiment, the anode assembly 1120 may have a plurality of strip zones $Z_n$ parallel to one another. The zones $Z_n$ are set such that during immersion, the intersection line between the substrate 1107 and electrolyte surface 1105 is parallel to boundaries between the zones $Z_n$. FIG. 11B illustrates a top view of an exemplary of zone map of the anode assembly 1120 shown in FIG. 11A. Arrow E indicates the direction of the movement of the intersection line between the substrate 1107 and the electrolyte surface 1105 when the substrate is descending along direction D. In one embodiment, a predetermined bias pattern, as shown in FIG. 11C, can be applied to the substrate 1107 during an immersion process. Referring to FIG. 11C, the x-axis indicates time and the y-axis indicates voltage. Lines $V_n$ in FIG. 11C indicates a bias voltage between a zone $Z_n$ and the substrate 1107. In this embodiment, the zones $Z_n$ are biased in a sequence of $Z_1, Z_2, \ldots, Z_n$. The values and duration of $V_n$ may be determined such that an uniform plating thickness profile is formed across the substrate 1107 during the immersing process. Methods of determining a plating thickness profile are illustrated in commonly assigned United States patent application filed on May 25, 2005 entitled "In-situ profile measurement in an electroplating process", which is hereby incorporated by reference in its entirety. It is to be noted that the zone map shown in FIGS. 11A and 11B, the bias pattern shown in FIG. 11C are schematic and exemplary. Since anode elements in the anode assembly 1120 may be biased independently, various zone segmentations are possible. In one aspect, a bias pattern may be designated for each anode element, no zone or only virtual zones are used. In one aspect, during an immersing process, an actual duration of a region on a substrate staying immersed may be tracked by considering the substrate rotation speed, immersing status for sensors. Thus the immersing process may be precisely monitored and controlled.

In another embodiment, in sensors 1170 in FIG. 11A may be used to determining the immersing status and/or current distribution of a region in the electrolyte 1103. The anode assembly 1120 can then be biased according to the sensor signals. Methods of monitoring and controlling an immersing process are illustrated in commonly assigned United States patent application filed on May 25, 2005 entitled "In-situ profile measurement in an electroplating process", which is hereby incorporated by reference in its entirety.

Figure 12:
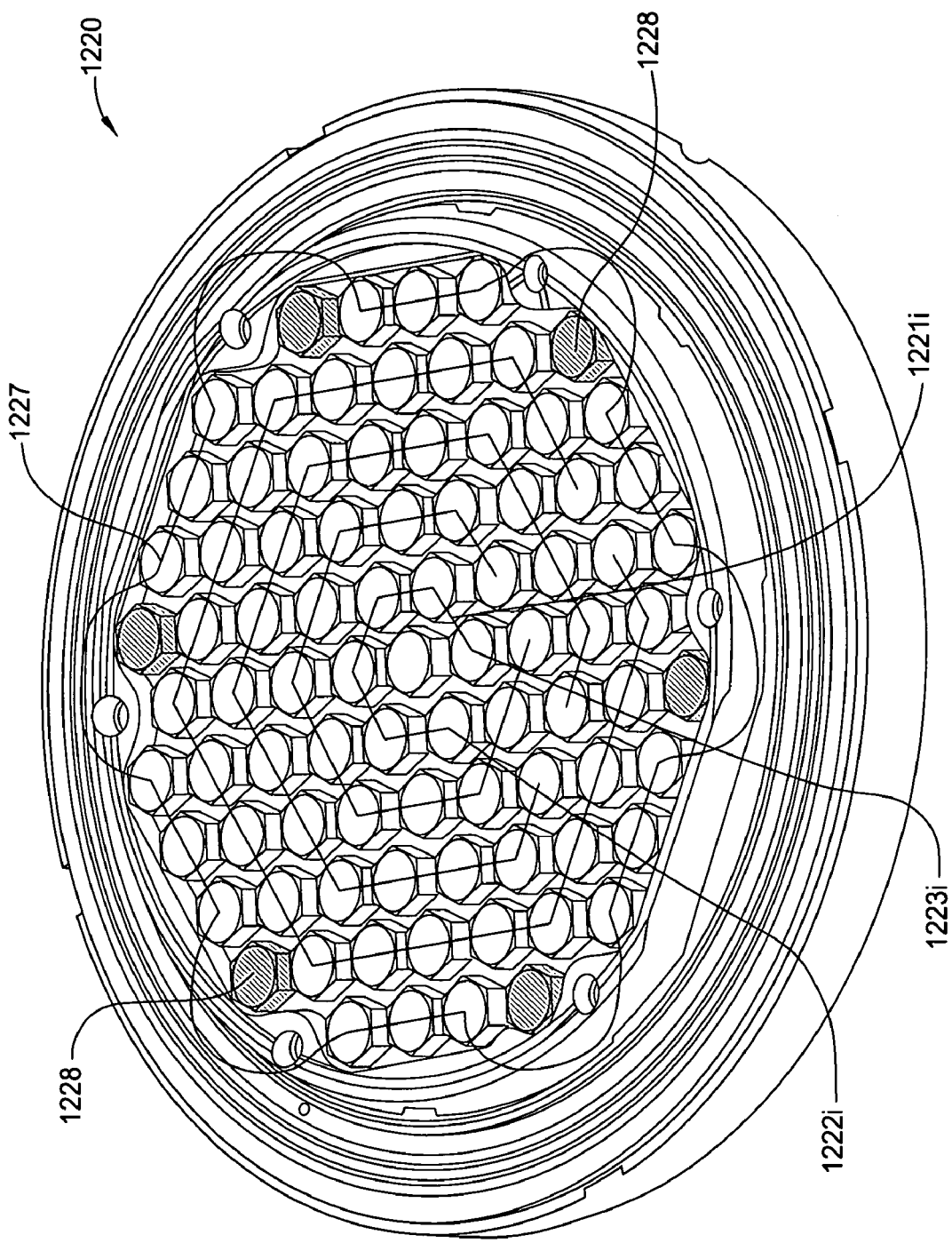
FIG. 12 illustrates a schematic view of an anode element grouping pattern in accordance with one embodiment of the present invention.

FIG. 12 illustrates a schematic view of an anode element grouping pattern in accordance with one embodiment of the present invention. An anode assembly 1220 is configured to be used in an electrochemical plating cell as an anode. The anode assembly 1220 generally comprises a plurality of anode elements 1227 each having a hexagonal surface and arranged in a hexagon pattern. The plurality of anode elements 1227 may be made from materials suitable for anode.

During a plating process, the plurality of anode elements 1227 may be biased individually or biased by group using a printed circuit board or connectors to achieve desired plating results. In one embodiment, the plurality of anode elements 1227 may be grouped to a plurality of circular sectors 1221*i* formed in a concentric manner, where i is a positive integer representing the ith sector of the anode elements 1227. Within each circular sector 1221*i*, the anode elements 1227 are connected in a series configuration between two terminations 1222*i* and 1223*i* configured to be adapted to a power supply circuit. Since a substrate being processed generally rotates about its center, the substrate is equally exposed to each anode element 1227 in a circular sector 1221*i*. Thus, the potential drop in each anode element 1227 in the series connection does not present a disadvantage to plating uniformity. Grouping of the anode elements 1227 by circular sectors 1221*i* simplifies the circuit for control and power supply and increases wiring flexibility. In one embodiment, the anode assembly 1220 comprises six circular sectors 1221*i*, having 1, 6, 12, 18, 24, and 24 anode elements respectively.

The anode assembly 1220 further comprises a plurality of deplating electrodes 1228 evenly distributed along a perimeter of the anode assembly 1220. The plurality of deplating electrodes 1228 are configured to be cathodically biased and to perform a deplating process to a contact pin, such as the contact pin 109 of FIG. 1. In one embodiment, the deplating electrodes 1228 are not wired in any circular sectors 1221*i* to avoid generating higher plating current by accumulated metal from a previous deplating process. In one embodiment, there are six deplating electrodes 1228 evenly distributed around the anode assembly 1220.

Figure 13:
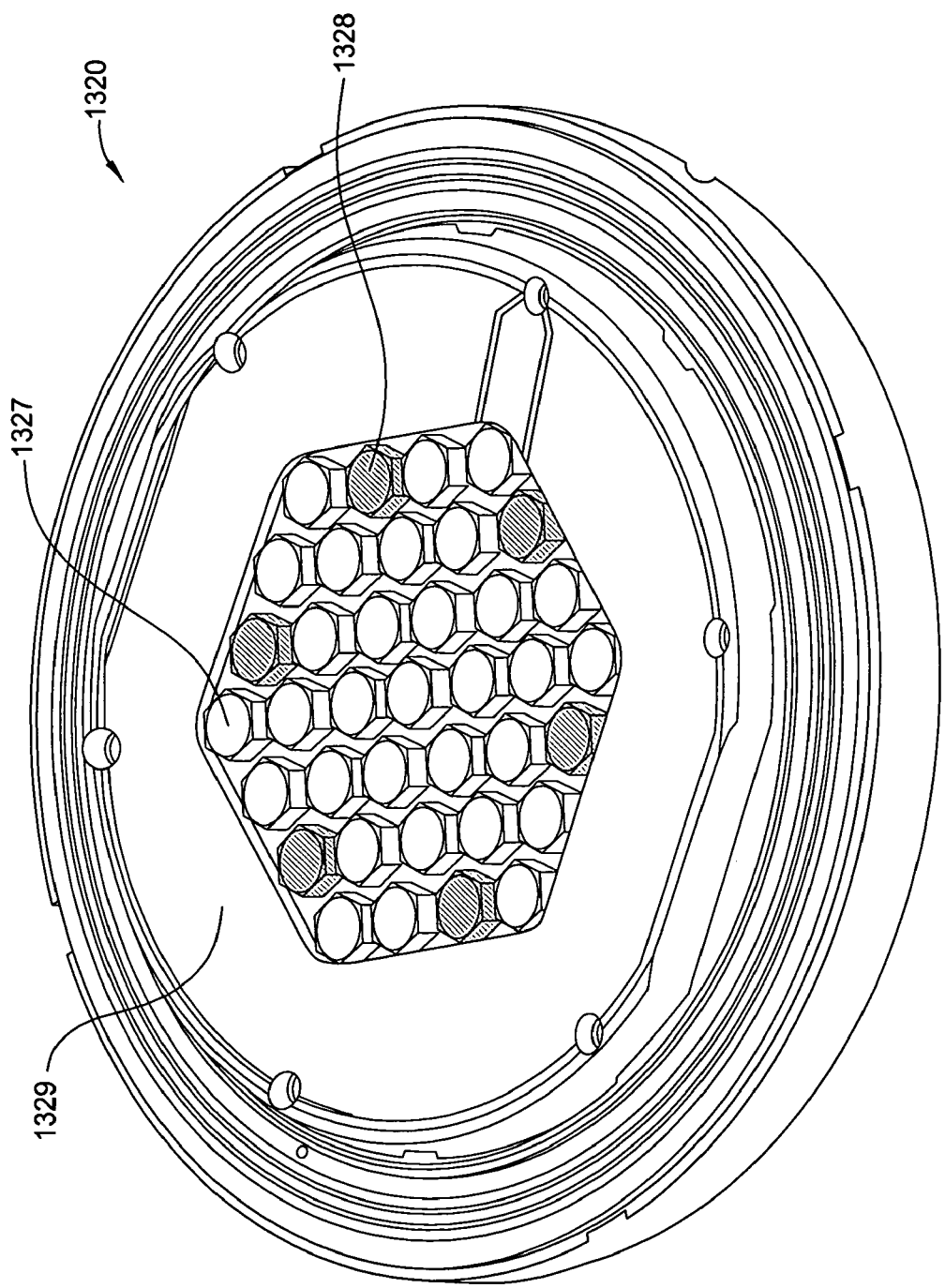
FIG. 13 illustrates a schematic view of an anode element grouping pattern in accordance with one embodiment of the present invention.

FIG. 13 illustrates a schematic view of an anode element grouping pattern in accordance with one embodiment of the present invention. An anode assembly 1320 comprises a shield 1329 adapting to process substrates smaller than the size of the anode assembly 1320. The shield 1329 covers an outer portion of the anode assembly 1320 only exposing anode elements 1327 and deplating electrodes 1328 in the center portion. The deplating electrodes 1328 are evenly distributed along an outer edge of the anode elements 1327.

Figure 14:
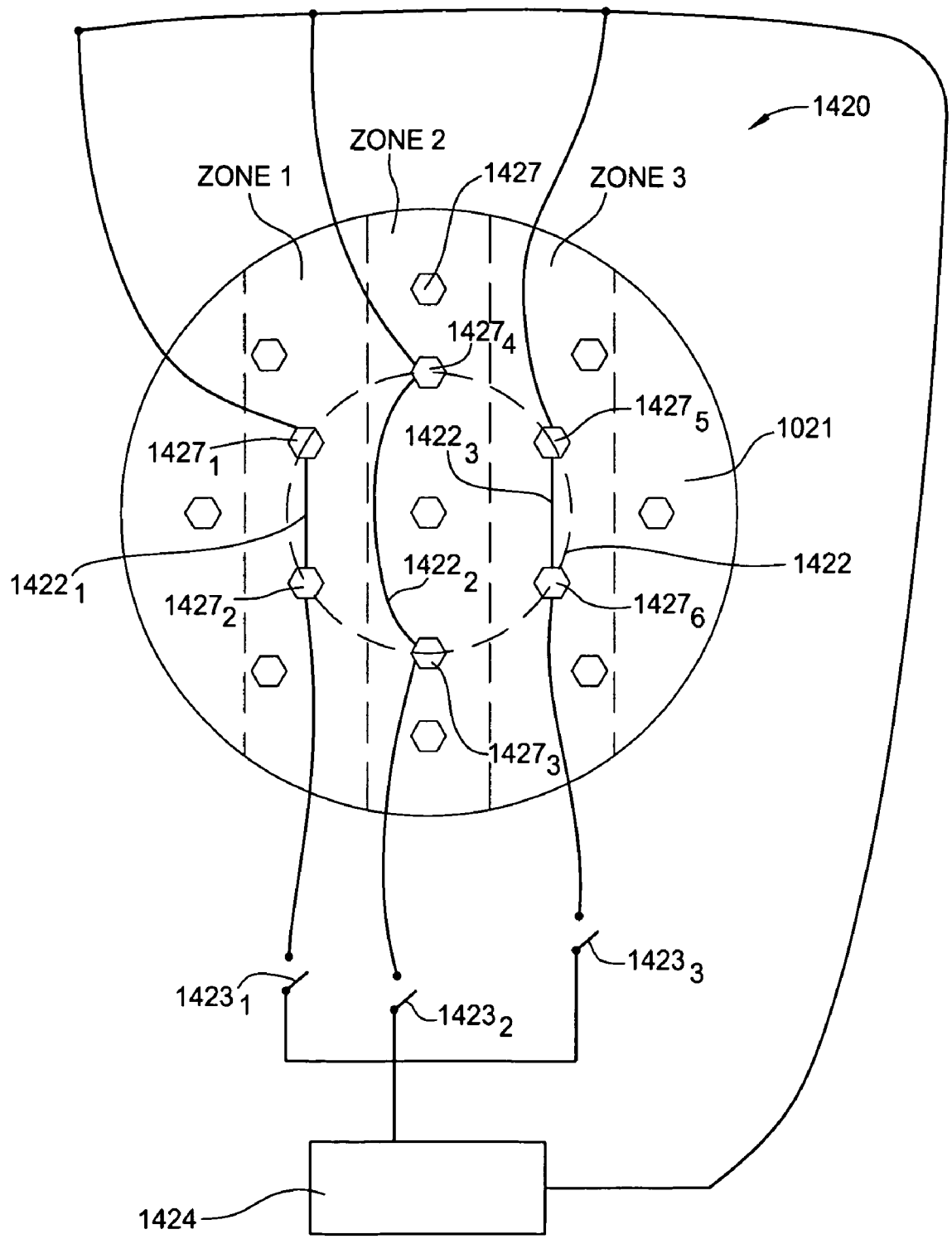
FIG. 14 illustrates a schematic view of an anode element grouping method in accordance with one embodiment of the present invention.

FIG. 14 illustrates a schematic top view of an anode assembly 1420. The anode assembly 1420 comprises a plurality of anode elements 1427 which are grouped to be biased in multiple zones and circular sectors. FIG. 14 illustrates one exemplary circular sector 1422 comprises anode elements 1427$_{1-6}$. The circular sector 1422 overlaps with parallel zones Zone$_{1-3}$. In one embodiment, the anode elements 1427$_{1-6}$ in the circular sector 1422 is further grouped into three sub sectors 1422$_{1-3}$ residing in Zones$_{1-3}$ respectively. Each sub sectors 1422$_{1-3}$ is connected to a power supply 1424 via a switch 1423$_{1-3}$ respectively. When the anode assembly 1420 needs to be biased by zones, for example, during immersing, the sub sectors may be biased individually. When the anode assembly 1420 needs to be biased by circular sectors, for example during a plating process, the sub sectors in a circular sector may be biased at the same time. The same configuration may be applied to each of the plurality of circular sectors of the anode assembly.

While the foregoing is directed to embodiments of the present invention, other and further embodiments of the invention may be devised without departing from the basic scope thereof, and the scope thereof is determined by the claims that follow.

The invention claimed is:

1. An apparatus for plating a conductive material on a substrate, comprising:
   a fluid basin configured to retain an electrolyte;
   a contact ring configured to support the substrate and contact the substrate electrically; and an anode assembly disposed in the fluid basin, wherein the anode assembly comprises:
- a frame member having a plurality of openings defining a pattern;
- a plurality of anode elements disposed in the plurality of openings of the frame member and arranged in the pattern defined by the plurality of openings, wherein the plurality of anode elements are isolated from each other; and
- a printed circuit board for biasing the plurality of anode elements individually or by group, the printed circuit board has a plurality of through holes defining the same pattern as the plurality of opening in the frame member, each through hole has a conductive plate formed therein, and the printed circuit board and the frame member are stacked together.

2. The apparatus of claim 1, wherein the plurality of anode elements are divided into a plurality of circular sectors arranged in a concentric manner by the printed circuit board, anode elements in each of the plurality of circular sectors are connected in series and biased simultaneously.

3. The apparatus of claim 1, wherein the plurality of anode elements are divided to a plurality of parallel zones by the printed circuit board, and the anode elements in each of the parallel zones are biased simultaneously.

4. The apparatus of claim 1, wherein the anode assembly further comprises a foil stacked between the frame member and the printed circuit board and configured for detecting any leakage of the electrolyte from the openings of the frame member, and the foil has a plurality of openings larger than the conductive plates in the through holes of the printed circuit board.

5. An electrochemical plating system, comprising:
- a fluid basin configured to retain an electrolyte;
- a substrate support having a contact ring configured to contact a substrate electrically; and
- an anode assembly comprising:
  - a printed circuit board having a plurality of through holes defining a pattern, wherein each through hole has a conductive plate formed therein;
  - a plurality of anode elements disposed in the plurality of through holes in the printed circuit board, wherein the printed circuit board is configured to connect the plurality of anode elements with a power supply; and
  - a frame member having a plurality of openings defining the pattern, wherein the frame member is stacked over the printed circuit board, and the plurality of anode elements are sealingly disposed in the plurality of openings.

6. A method for plating a conductive material on a substrate, comprising:
providing an anode assembly disposed in an electrolyte, wherein the anode assembly comprises:
- a frame member having a plurality of openings defining a pattern; and
- a plurality of anode elements disposed in the plurality of opening of the frame member and arranged in the pattern defined by the plurality of openings, wherein the plurality of anode elements are isolated from each other;

contacting the substrate using a contact ring;
immersing the substrate in the electrolyte; and
applying a plating bias between the contact ring and the anode assembly, wherein applying the plating bias comprises providing electric power to the plurality of anode elements via conductive plates formed in a plurality of through holes of a printed circuit board, and the plurality of through holes of the printed circuit board are aligned with the plurality of openings of the frame member.

7. The method of claim 6, further comprising:
sensing potential or current in the electrolyte; and
adjusting the electric power on the plurality of anode elements.

8. The method of claim 6, wherein applying plating bias to the plurality of anode elements further comprises:
dividing the plurality of anode elements into a plurality of circular sectors arranged in a concentric manner by the printed circuit board; and
powering each of the plurality of circular sectors independently.

9. The method of claim 8, wherein dividing the plurality of anode elements into a plurality of circular sectors comprises connecting the anode elements in each of the plurality of circular sectors in series.

10. The method of claim 6, wherein applying plating bias to the plurality of anode elements further comprises:
dividing the plurality of anode elements into a plurality of parallel zones via the printed circuit board; and
powering each of the plurality of parallel zones independently.

11. The method of claim 10, wherein immersing the substrate in the electrolyte comprising applying immersing bias to the respective parallel zones corresponding to immersed portion of the substrate.

* * * * *